US012124658B2

(12) United States Patent
Ziraknejad et al.

(10) Patent No.: US 12,124,658 B2
(45) Date of Patent: Oct. 22, 2024

(54) RETROFIT TOUCHLESS INTERFACES FOR CONTACT-BASED INPUT DEVICES

(71) Applicant: NZ Technologies Inc., Vancouver (CA)

(72) Inventors: Nima Ziraknejad, North Vancouver (CA); Pranav Saxena, Vancouver (CA); Yodan Karyanto, Burnaby (CA); Nasim Jahangiri, North Vancouver (CA); David Fung, Vancouver (CA)

(73) Assignee: NZ Technologies Inc., Vancouver (CA)

( * ) Notice: Subject to any disclaimer, the term of this patent is extended or adjusted under 35 U.S.C. 154(b) by 0 days.

(21) Appl. No.: 17/992,781

(22) Filed: Nov. 22, 2022

(65) Prior Publication Data

US 2023/0161443 A1  May 25, 2023

Related U.S. Application Data

(63) Continuation of application No. PCT/CA2021/050707, filed on May 25, 2021.

(60) Provisional application No. 63/163,000, filed on Mar. 18, 2021, provisional application No. 63/105,161, filed on Oct. 23, 2020, provisional application No. 63/029,708, filed on May 25, 2020.

(51) Int. Cl.
*G06F 3/044* (2006.01)
*G06F 3/01* (2006.01)

(52) U.S. Cl.
CPC .............. *G06F 3/044* (2013.01); *G06F 3/017* (2013.01)

(58) Field of Classification Search
None
See application file for complete search history.

(56) References Cited

U.S. PATENT DOCUMENTS

| 8,443,302 | B2 | 5/2013 | Zhang et al. |
| 9,658,695 | B2 * | 5/2017 | Flagg ................... A63F 13/213 |
| 9,954,525 | B2 * | 4/2018 | Heimann ............ G06F 3/04164 |
| 11,256,413 | B2 * | 2/2022 | Tanemura ........... G06F 3/04842 |
| 2008/0100572 | A1 | 5/2008 | Boillot |
| 2014/0125590 | A1 | 5/2014 | Flagg et al. |
| 2014/0327645 | A1 | 11/2014 | Matthews et al. |
| 2015/0220147 | A1 | 8/2015 | King et al. |
| 2015/0248207 | A1 | 9/2015 | Dorfner |

OTHER PUBLICATIONS

Wimmer et al.: "Thracker—Using Capacitive Sensing for Gesture Recognition", Distributed Computing Systems Workshops, pp. 64-64, Jul. 4, 2006.

* cited by examiner

*Primary Examiner* — Jeffrey S Zweizig
(74) *Attorney, Agent, or Firm* — Todd A. Rattray; Oyen Wiggs Green & Mutala LLP

(57) ABSTRACT

A retrofit interface apparatus interfaces with a target device to provide the target device with touchless user input. The apparatus comprises: a touchless sensing system comprising one or more sensors responsive to touchless input made by a human user and for generating one or more corresponding sensor input signals; a controller connected to receive the one or more sensor input signals from the touchless sensing system and configured to generate, based on the one or more sensor input signals, a corresponding control signal; and the controller connectable to the target device to bypass a touch-based input of the target device and to provide the control signal as an input to an existing control system of the target device to thereby cause the control system of the target device to operate the target device based on the control signal.

20 Claims, 16 Drawing Sheets

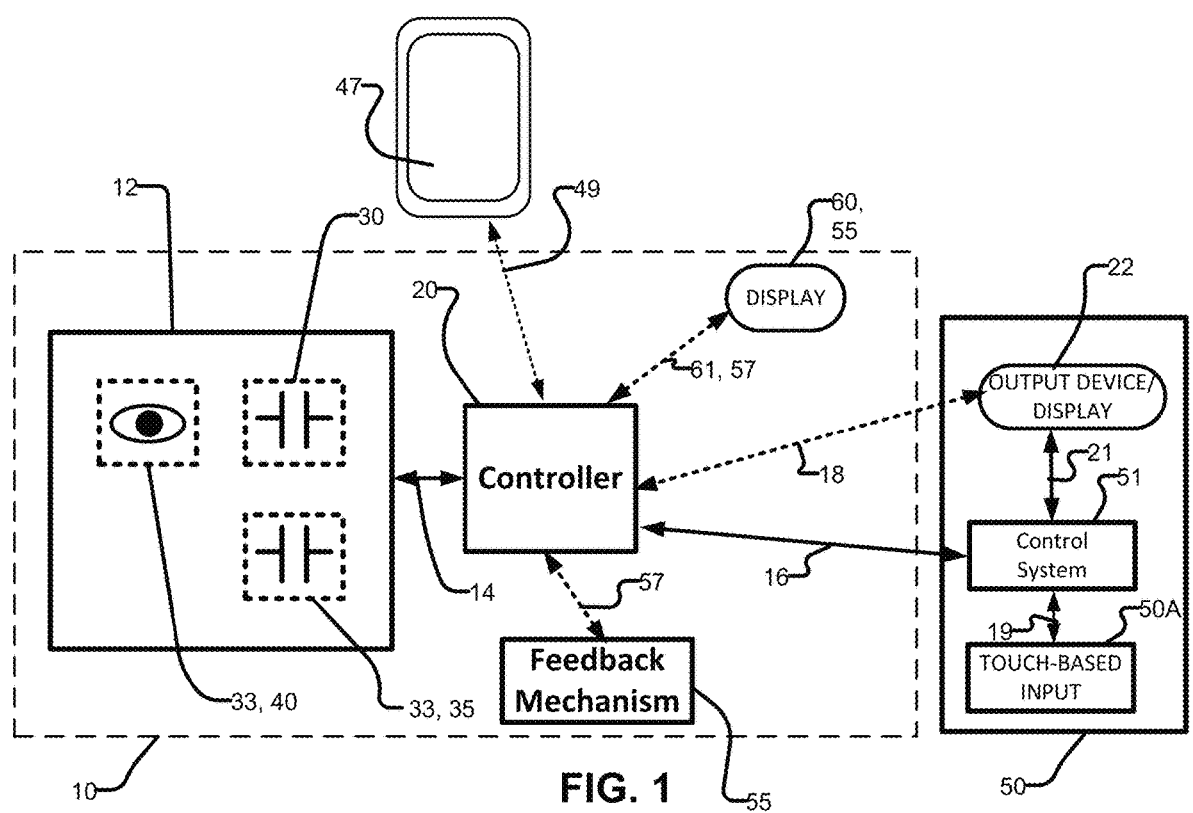

RETROFIT TOUCHLESS INTERFACES FOR CONTACT-BASED INPUT DEVICES

RELATED APPLICATIONS

This application is a continuation of Patent Cooperation Treaty (PCT) application No. PCT/CA2021/050707 having an international filing date of 25 May 2021, which in turn claims priority from, and for the purposes of the United States the benefit under 35 USC 119 in relation to U.S. applications No. 63/029,708 filed 25 May 2020, No. 63/105,161 filed 23 Oct. 2020 and No. 63/163,000 filed 18 Mar. 2021. All of the applications set out in this paragraph are hereby incorporated herein by reference for all purposes.

FIELD

This technology relates to touchless interaction with machines and the like. Particular embodiments provide retrofit touchless interfaces and/or inputs for use with existing target devices to provide touchless functionality in the place of contact-based human-machine interfaces (HMIs) and/or contact-based inputs for such target devices and methods of installation and/or operation of same. Other embodiments provide custom and/or modular touchless interfaces and/or inputs for facilitating the interaction of humans with machines or other target devices and methods of installation and/or operation of same.

BACKGROUND

The world is saturated with touch-based interfaces—including touchscreens, keypads, light switches, elevator buttons, etc. These interfaces are inexpensive to produce and primitively intuitive to use. Human-Machine Interfaces (HMI) of the touchless variety are currently limited primarily to industry-specific niche applications, such as for gaming, entertainment, automobile panels, home automation, and clinical sterile interactions.

This paradigm has changed in light of the COVID-19 pandemic and the growing awareness to avoid common avenues for infection transmission, including, for example, high-traffic touch surfaces that are commonly exposed to a large number of individuals. There is a growing need for touchless and/or contactless solutions for HMI systems. As a particular example, and without limiting the generality of the general need, there is a particular need for touchless and/or contactless solutions for HMI systems used in hospitals, medical clinics, surgical environments and/or the like. However, current touchless HMI systems are inferior to touch-based systems for many applications. Current touch-based HMI systems often have tactile feedback, can be faster than touchless solutions, and can be easier and/or more intuitive to use than touchless solutions.

Hence, there is a desire for improved touchless HMIs which provide intuitive and practical user experiences, tactile feedback and/or the like. There is a desire to provide touchless interaction for the most common touch-based HMIs and input interfaces present in our society today (e.g. to retrofit touch-based HMIs and input interfaces of target devices with touchless solutions).

SUMMARY

Aspects of the invention provide methods and apparatus for retrofitting to existing target devices equipped with touch-based user input devices to provide touchless user input to the target device. Retrofit methods and apparatus according to some embodiments comprise a capacitive sensor for touchless sensing and a touch-actuation component (TAC) to push, slide, rotate or otherwise interact with the touch-based input (e.g. a button, latch, door handle and/or the like) of the target device. Retrofit methods and apparatus may also comprise user feedback which could be embodied, by way of non-limiting example, using sonic wave transmission (SWT) for touchless haptic feedback (THF) (i.e. tactile), using a display screen (e.g. an LCD or LEDs) for visual feedback, using sound cues for auditory feedback and/or the like. User feedback may be desirable to provide an intuitive user experience that is easy to learn and quick to use. It may be desirable for the timing of the use of retrofit methods and apparatus to be on the same (or comparable) time scale as the target touch-based system or not considerably longer than the target touch-based system.

Other aspects of the invention provide a retrofit interface apparatus for interfacing with a control system of a target device. The apparatus comprises a touchless sensing system for detecting a touch-free input corresponding to a gesture made by a human user and for generating one or more corresponding input signals. The apparatus also comprises a controller connected to receive the input signals from the touchless sensing system and to generate, based on the input signals, a corresponding control signal and a corresponding display signal. The controller is connected to provide the display signal to the control system of the target device and/or to a display of the target device. The display signal may cause the display to display a corresponding visual indicia based on the display signal. The controller is connected to provide the control signal to the control system of the target device to thereby cause the control system of the target device to operate the target device based on the control signal.

Additional non-limiting aspects of the invention include the following:

1. A retrofit interface apparatus for retrofitting to a touch-based input of a target device, the apparatus comprising:
   a touchless sensing system comprising one or more sensors responsive to touch-free input from a human user and for generating a corresponding sensor input signal;
   a controller connected to receive the input signal from the touchless sensing system and configured to generate, based on the sensor input signal, a corresponding actuator signal;
   an actuator locatable and moveable to interact physically with the touch-based input of the target device, the actuator connectable to receive the actuator signal and, in response to receiving the actuator signal, moveable to interact physically with the touch-based input of the target device to thereby provide an input to the target device.

2. An apparatus according to aspect 1 or any other aspect herein wherein the touchless sensing system comprises one or more capacitive sensors which are sensitive to disturbances in their electric fields caused by a human body part in proximity to the one or more capacitive sensors.

3. An apparatus according to aspect 2 or any other aspect herein wherein the capacitive sensing system comprises a multi-layered printed circuit board comprising a least one first electrode and a plurality of second electrodes.

4. An apparatus according to aspect 3 or any other aspect herein wherein the plurality of second electrodes is arranged at least partially around a perimeter of at least one of: a panel of the retrofit interface apparatus; and a panel of the target apparatus.
5. An apparatus according to aspect 3 or any other aspect herein wherein the plurality of second electrodes is arranged at least partially around a perimeter of at least one of: a display panel of the retrofit interface apparatus; and display a panel of the target apparatus.
6. An apparatus according to any one of aspects 1 to 5 or any other aspect herein wherein the touchless sensing system comprises a microphone sensor and the controller is configured to interpret voice commands based on the sensor input signal.
7. An apparatus according to any one of aspects 1 to 6 or any other aspect herein wherein the actuator comprises one or more of a linear actuator and a rotational actuator.
8. An apparatus according to any one of aspects 1 to 6 or any other aspect herein wherein the actuator comprises an array comprising a plurality of actuators, each actuator corresponding to a corresponding one of a plurality of touch-based inputs of the target device and wherein the controller is configured to provide actuator signals to independently actuate each actuator based on the sensor input signal.
9. An apparatus according to any one of aspects 1 to 8 or any other aspect herein comprising a touchless feedback system for providing feedback capable of being sensed by the human user as to how the human user has interacted with the touchless sensing system.
10. An apparatus according to aspect 9 or any other aspect herein wherein the touchless feedback system provides different feedback to the user based on different interactions between the user and the touchless sensing system.
11. An apparatus according to any one of aspects 9 or 10 or any other aspect herein wherein the touchless feedback system comprises one or more sonic wave transmitters.
12. An apparatus according to any one of aspects 9 to 11 or any other aspect herein wherein the touchless feedback system comprises one or more display screens.
13. An apparatus according to any one of aspects 1 to 12 or any other aspect herein wherein the controller is connectable to receive a mobile device input signal from a mobile device of the human user and configured to generate, based on the mobile device input signal, a corresponding actuator signal and wherein the actuator, in response to receiving the actuator signal, is moveable to interact physically with the touch-based input of the target device to thereby provide an input to the target device.
14. A retrofit interface apparatus for interfacing with a target device to provide the target device with touchless user input, the apparatus comprising:
   a touchless sensing system comprising one or more sensors responsive to touchless input made by a human user and for generating one or more corresponding sensor input signals;
   a controller connected to receive the one or more sensor input signals from the touchless sensing system and configured to generate, based on the one or more sensor input signals, a corresponding control signal; and
   the controller connectable to the target device to bypass a touch-based input of the target device and to provide the control signal as an input to an existing control system of the target device to thereby cause the control system of the target device to operate the target device based on the control signal.
15. An apparatus according to aspect 14 wherein the controller is configured to generate, based on the one or more sensor input signals, the corresponding control signal to emulate a signal of a corresponding input of the touch-based input of the target device.
16. An apparatus according to any one of aspects 14 or 15 or any other aspect herein wherein the touchless sensing system comprises one or more capacitive sensors which are sensitive to disturbances in their electric fields caused by a human body part in proximity to the one or more capacitive sensors.
17. An apparatus according to aspect 16 or any other aspect herein wherein:
   the one or more capacitive sensors comprise one or more first capacitive sensors located and/or oriented for detecting one or more location characteristics of the body of the user and generating a corresponding location sensor signal;
   the touchless sensing system comprises a second sensor located and/or oriented for detecting one or more secondary characteristics of the body of the user and for generating a secondary sensor signal, the secondary characteristics at least partially different from the location characteristics; and
   wherein the one or more input signals comprise the location sensor signal and the secondary sensor signal and the controller is configured to generate the control signal based on both the location sensor signal and the secondary sensor signal.
18. An apparatus according to aspect 17 or any other aspect herein wherein the location characteristics comprise a location of a first body part of the user and the secondary characteristics comprise one or more of the: size, volume, shape, and/or angle of approach of the body part of the user.
19. An apparatus according to aspect 18 or any other aspect herein wherein the controller is configured to determine an updated location of the first body part based on a combination of the location sensor signal and the secondary sensor signal, by updating the location of the first body part determined by the controller in response to the location sensor signal and the controller is configured to generate the control signal based on the updated location of the first body part.
20. An apparatus according to aspect 17 or any other aspect herein wherein the location characteristics comprise a location of a first body part of the user and the secondary characteristics comprise a location of a second body part of the user.
21. An apparatus according to aspect 20 or any other aspect herein wherein the controller is configured to determine an updated location of the first body part based on a combination of the location sensor signal and the secondary sensor signal, by updating the location of the first body part determined by the controller in response to the location sensor signal and the controller is configured to generate the control signal based on the updated location of the first body part.
22. An apparatus according to any one of aspects 17 to 21 or any other aspect herein wherein the second sensor comprises one or more second capacitive sensors sen- 23. An apparatus according to any one of aspects 17 to 22 or any other aspect herein wherein the one or more first capacitive sensors are capable of sensing electric field disturbance over a first detection range and the second capacitive sensor are capable of sensing electric field disturbances of a second detection range.
24. An apparatus according to aspect 23 or any other aspect herein wherein the second detection range is wider than the first detection range.
25. An apparatus according to aspect 24 or any other aspect herein wherein the first detection range is located within the second detection range.
26. An apparatus according to aspect 23 or any other aspect herein wherein the first detection range and the second detection range are non-overlapping.
27. An apparatus according to any one of aspects 17 to 21 or any other aspect herein wherein the second sensor comprises an optical sensor sensitive to changes in electromagnetic radiation reflected from the body of the user.
28. An apparatus according to according to any one of aspects 17, 18, 20 and 22-27 or any other aspect herein wherein the controller comprises a machine learning data-trained model trained to use the location sensor signal and the secondary sensor signal to determine a location of a first body part and to generate, based on the location of the first body part, the control signal.
29. An apparatus according to aspect 27 or any other aspect herein wherein the optical sensing system comprises a thermal camera, an infrared camera, an RBG camera, a time-of-flight camera, a stereoscopic camera, a structured light camera and/or a 3D camera.
30. An apparatus according to any one of aspects 27 or 29 or any other aspect herein wherein the controller is configured to determine a presence of the user in a vicinity of the target device based on the secondary sensor signal.
31. An apparatus according to aspect 30 or any other aspect herein wherein the controller is configured to calibrate the generation of the control signal in response to determination of the presence and/or a lack of presence of the user in the vicinity of the target device.
32. An apparatus according to aspect 27 or any other aspect herein wherein the optical sensor comprises one or more lasers for emitting laser radiation and a detector located to receive laser radiation reflected from a body part of the user.
33. An apparatus according to aspect 32 or any other aspect herein wherein the optical sensor comprises suitable optics located to receive the emitted laser radiation and to generate a 2-dimensional plane of laser radiation and wherein the controller is configured to estimate two orthogonal spatial coordinates of the body part based on the body part intersecting the 2-dimensional plane.
34. An apparatus according to aspect 33 or any other aspect herein wherein the 2-dimensional detection plane has a normal vector that is substantially parallel (e.g. to within 10° or 15°) to a normal vector of a planar surface that is tangent to at least one of: a display screen of the retrofit interface apparatus and a display screen of the target device.

35. An apparatus according to aspect 33 or any other aspect herein wherein the controller is configured to estimate a third orthogonal spatial coordinate of the body part based on the location sensor signal.
36. An apparatus according to aspect 35 or any other aspect herein wherein third orthogonal spatial coordinate is a z-coordinate which reflects a distance of the body part from a plane along a normal to the plane and the first and second orthogonal spatial coordinates are transverse x- and y-coordinates which reflect distances of the body part in directions that are orthogonal to the normal of the plane and orthogonal to one another.
37. An apparatus according to aspect 36 or any other aspect herein wherein the controller is triggered to estimate the x- and y-coordinates in response to the controller determining that the z-coordinate has crossed a configurable threshold.
38. An apparatus according to any one of aspects 36 to 37 wherein the plane is tangential to at least one of: a display screen of the retrofit interface apparatus and a display screen of the target device.
39. An apparatus according to any one of aspects 33 to 38 or any other aspect herein wherein the controller is configured to select the control signal to be a particular control signal from among a plurality of potential control signals based on the location sensor signal and the secondary sensor signal.
40. An apparatus according to aspect 39 or any other aspect herein wherein the controller is configured to activate the particular control signal based on the secondary signal.
41. An apparatus according to any one of aspects 14 to 40 or any other aspect herein wherein at least one of the retrofit interface apparatus and the target device comprises a display screen.
42. An apparatus according to any one of aspects 41 or any other aspect herein wherein the controller is configured, based on the one or more input signals, to estimate a location of a portion of the hand of the human user.
43. An apparatus according to aspect 42 or any other aspect herein wherein the controller is configured to generate a display signal based on the estimated location of the portion of the hand of the user which causes the display screen to display an indicia (e.g. a cursor, pointer and/or the like, a location of the displayed indicia on the display screen based on the estimated location of the portion of the hand.
44. An apparatus according to any one of aspects 41 to 43 or any other aspect herein wherein the controller is configured, based on the one or more sensor input signals, to estimate a proximity of the portion of the hand of the user to the display screen.
45. An apparatus according to aspect 44 or any other aspect herein wherein the display signal causes the display screen to change an appearance of the displayed indicia based on the estimated proximity of the portion of the hand of the user.
46. An apparatus according to aspect 45 or any other aspect herein wherein the change of the appearance of the displayed indicia comprises at least one of a change of color of the displayed indicia, size of the displayed indicia, brightness (intensity) of the displayed indicia, changing shape of the displayed indicia, changing a color gradient of the displayed indicia and adding other indicia to the displayed indicia.

47. An apparatus according to any one of aspects 44 to 46 or any other aspect herein wherein the controller is configured to change the control signal and to thereby change the operation of the target device based on the estimated proximity of the portion of the hand of the user.
48. An apparatus according to aspect any one of aspects 41 to 47 or any other aspect herein wherein the display screen is configured to display one or more virtual inputs (e.g. virtual buttons).
49. An apparatus according to aspect 48 or any other aspect herein wherein the display signal causes the display screen to change an appearance of the one or more displayed virtual inputs based on the estimated location of the portion of the hand.
50. An apparatus according to any one of aspects 48 to 49 or any other aspect herein wherein the controller is configured, based on the one or more input signals, to estimate a proximity of a portion of the hand of the user to the display screen.
51. An apparatus according to aspect 50 or any other aspect herein the display signal causes the display screen to change an appearance of the one or more displayed virtual inputs based on the estimated proximity of the portion of the hand of the user.
52. An apparatus according to any one of aspects 50 to 51 or any other aspect herein wherein the controller is configured to change the control signal and to thereby change the operation of the target device based on the estimated proximity of the portion of the hand of the user.
53. An apparatus according to aspect 49 or any other aspect herein wherein the controller is configured, based on the one or more input signals, to detect a circular motion made with a portion of the hand of the user.
54. An apparatus according to aspect 53 or any other aspect herein wherein the display signal causes the display screen to change an appearance of the one or more displayed virtual inputs based on the detected circular motion.
55. An apparatus according to any one of aspects 53 or 54 or any other aspect herein wherein the controller is configured to change the control signal and to thereby change the operation of the target device based on the detected circular motion.
56. An apparatus according to aspect 49 or any other aspect herein wherein the controller is configured, based on the one or more input signals, to detect that a portion of the hand of the user lacks motion (to within a threshold) for a threshold period of time.
57. An apparatus according to aspect 56 or any other aspect herein wherein the display signal causes the display screen to change an appearance of the one or more displayed virtual inputs based on the detected lack of motion.
58. An apparatus according to any one of aspects 56 or 57 or any other aspect herein wherein the controller is configured to change the control signal and to thereby change the operation of the target device based on the detected lack of motion.
59. An apparatus according to aspect 52 or any other aspect herein wherein the display signal causes the display screen to vary a size of the displayed indicia in a manner correlated to the proximity of the portion of the hand to the display screen, and wherein the controller is configured to change the control signal and to thereby change the operation of the target device when: the size of the displayed indicia is the same (to within a suitable threshold) of one of the virtual inputs; and the location of the portion of the hand lacks motion (with a suitable threshold) for a threshold period of time.
60. An apparatus according to any one of aspects 14 to 40 wherein the retrofit interface apparatus comprises one of more visible light sources.
61. An apparatus according to aspect 60 or any other aspect herein wherein the controller is configured, based on the one or more input signals, to estimate a location of a portion of the hand of the human user.
62. Apparatus according to aspect 61 wherein the display signal generated by the controller causes the display to illuminate or change a color of illumination of at least one of the one or more visible light sources according to the estimated location of the portion of the hand.
63. An apparatus according to any one of aspects 60 to 62 or any other aspect herein wherein the controller is configured, based on the one or more input signals, to estimate a proximity of the portion of the hand of the user to the display.
64. An apparatus according to aspect 57 or any other aspect herein wherein the controller is configured to change the control signal and to thereby change the operation of the target device based on the estimated proximity of the portion of the hand of the user.
65. An apparatus according to any one of aspects 14 to 64 or any other aspect herein wherein the controller is configured, based on the one or more input signals, to estimate a line-of-sight vector of the human user.
66. An apparatus according to aspect 65 or any other aspect herein wherein the controller is configured, based on the one or more input signals, to estimate a position of a portion of the hand of the user and wherein the controller is configured to generate the control signal based at least in part on a combination of the estimated the line-of-sight vector and the estimate position of the portion of the hand of the user.
67. An apparatus according to any one of aspects 65 or 66 or any other aspect herein wherein at least one of the retrofit interface apparatus and the target device comprises a display screen and wherein the controller is configured to generate a display signal, which causes the display screen to skew an image displayed by the display screen based on the estimated line of sight vector.
68. An apparatus according to any one of aspects 14 to 67 or any other aspect herein wherein at least one of the retrofit interface apparatus and the target device comprises a display screen and wherein the controller is configured to cause the display screen to display a warning message when an estimated proximity of the portion of the hand is too close to the display screen.
69. An apparatus according to any one of aspects 14 to 68 or any other aspect herein further comprising a visible light source located and/or oriented to illuminate a portion of the hand of the user when the portion of the hand is positioned within a detection range of the touchless sensing system.
70. An apparatus according to any one of aspects 1 to 69 or any other aspect herein wherein target system comprises a display.
71. An apparatus according to aspect 69 or any other aspect herein where at least a portion of the retrofit interface apparatus is embodied as a frame which extends at least partially around a perimeter of the display of the target system, so that the display of the target system is visible to the human user.

72. An apparatus according to aspect 71 or any other aspect herein where the frame extends around the perimeter of the display of the target system, so that the display of the target system is visible to the human user through an aperture defined by the frame.

73. An apparatus according to any one of aspects 70 to 72 or any other aspect herein wherein the display comprises a display screen and the retrofit interface apparatus comprises a layer of transparent conducting material (e.g. Indium Tin Dioxide and/or the like) located on a user-facing side of the display screen.

74. An apparatus according to aspect 73 or any other aspect herein wherein the touchless sensing system comprises one or more capacitive sensors and the layer of transparent conducting material located on the user-facing side of the display screen comprises an electrode of the one or more capacitive sensors.

75. An apparatus according to any one of aspects 70 to 74 comprising a plurality of sonic transducers formed around a perimeter of the display (e.g. on the frame).

76. An apparatus according to any one of aspects 1 to 68 wherein the retrofit interface apparatus comprises a display.

77. An apparatus according to aspect 76 or any other aspect herein wherein the touchless sensing system and the display are fabricated as an integrated module.

78. An apparatus according to aspect 77 or any other aspect herein wherein the display comprises a display screen coated by a transparent conducting material (e.g. Indium Tin Dioxide or the like).

79. An apparatus according to any one of aspects 76 to 78 or any other aspect herein wherein the touchless sensing system comprises one or more capacitive sensors and the coating of transparent conducting material comprises an electrode of the one or more capacitive sensors.

80. An apparatus according to any one of aspects 77 to 79 further comprising a plurality of sonic transducers located around the perimeter of the integrated module.

81. An apparatus according to aspect 16 or any other aspect herein wherein at least a portion of the one or more capacitive sensors are located around a perimeter of a display of the target device and are sensitive to disturbances in an their electric fields caused by a human body part in proximity to a user-facing side of the display in a middle of the perimeter.

82. An apparatus according to aspect 16 or any other aspect herein wherein at least one electrode of each of the one or more capacitive sensors is located on a user-facing side of a display of the target device, the at least one electrode of each of the one or more capacitive sensors fabricated from transparent conductive material, so that the human user can see the display of the target device through the at least one electrode of each of the one or more capacitive sensors.

83. An apparatus according to aspect 82 or any other aspect herein wherein both electrodes of each of the one or more capacitive sensors are located on a user-facing side of a display of the target device and both of the electrodes of each of the one or more capacitive sensors is fabricated from transparent conductive material, so that the human user can see the display of the target device through the one or more capacitive sensors.

84. An apparatus according to any one of aspects 81 to 83 wherein:
  the touchless sensing system comprises one or more optical sensors located around the perimeter of the display and sensitive to changes in electromagnetic radiation reflected from the body of the user on the user-facing side of the display;
  the one or more sensor signals comprise one or more capacitive sensor signals from the one or more capacitive sensors and one or more optical sensor signals from the one or more optical sensors; and
  the controller is configured to generate the control signal based on both the one or more capacitive sensor signals and the one or more optical sensor signals.

85. An apparatus according to aspect 84 or any other aspect herein wherein each of the one or more optical sensors comprises one or more lasers for emitting laser radiation and a detector located to receive laser radiation reflected from a body part of the user.

86. An apparatus according to aspect 85 wherein each optical sensor comprises suitable optics located to receive the emitted laser radiation and to generate a 2-dimensional plane of laser radiation and wherein the controller is configured to estimate two orthogonal spatial coordinates of the body part based on the body part intersecting the 2-dimensional plane.

87. An apparatus according to aspect 86 or any other aspect herein wherein the controller is configured to estimate a third orthogonal spatial coordinate of the body part based on the capacitive sensor signal.

88. An apparatus according to aspect 87 or any other aspect herein wherein third orthogonal spatial coordinate is a z-coordinate which reflects a distance of the body part from a plane that is tangential to the display of the target device along a normal to the plane and the first and second orthogonal spatial coordinates are transverse x- and y-coordinates which reflect distances of the body part in directions that are orthogonal to the normal of the plane and orthogonal to one another.

89. A retrofit interface apparatus for interfacing with a target device comprising a display and a control system for operating the target device to provide the target device with touchless user input, the apparatus comprising:
  a touchless sensing system comprising one or more sensors responsive to touchless input made by a human user and for generating one or more corresponding sensor input signals;
  an interface controller connected to receive the one or more sensor input signals from the touchless sensing system and configured to generate, based on the one or more sensor input signals, a corresponding control signal, the interface controller connectable to the target device to bypass a touch-based input of the target device and to provide the control signal as an input to the control system to thereby cause the control system to operate the target device based on the control signal; and
  wherein at least a portion of the retrofit interface apparatus is embodied as a frame which extends at least partially around a perimeter of the display of the target system, so that the display of the target system is visible to the human user.

90. An apparatus according to aspect 89 or any other aspect herein where the frame extends around the perimeter of the display of the target system, so that the display of the target system is visible to the human user through an aperture defined by the frame.
91. An apparatus according to any one of aspects 89 or 90 or any other aspect herein wherein the interface controller is configured to generate, based on the one or more sensor input signals, the corresponding control signal to emulate a signal of a corresponding input of the touch-based input of the target device.
92. An apparatus according to any one of aspects 89-91 or any other aspect herein wherein the touchless sensing system comprises one or more capacitive sensors sensitive to changes in their electric fields caused by a human body part in proximity to the one or more capacitive sensors and for generating one or more corresponding capacitive sensor signals which form at least part of the sensor input signals, the one or more capacitive sensors supported on the frame and extending at least partially around a perimeter of the display.
93. An apparatus according to aspect 92 or any other aspect herein wherein the touchless sensing system comprises one or more optical sensors sensitive to electromagnetic radiation reflected from the human body part for generating one or more corresponding optical sensor signals which form at least part of the sensor input signals, the one or more optical sensors supported on the frame.
94. An apparatus according to aspect 93 wherein the controller is configured to generate the control signal based on both the one or more capacitive sensor signals and the one or more optical sensor signals.
95. An apparatus according to any one of aspects 89-94 or any other aspect herein comprising any of the features, combinations of features and/or sub-combinations of features of any of aspects 1 to 80.
96. A method for interfacing with a target device to provide the target device with touchless user input, the method comprising:
detecting a touch-free input corresponding to a gesture made by a human user and generating one or more corresponding input signals in response thereto;
providing a controller connected to receive the one or more input signals and generating, by the controller and based on the one or more input signals, a corresponding control signal; and
connecting the controller to the target device to bypass a touch-based input of the target device and to provide the control signal as an input to an existing control system of the target device to thereby cause the control system of the target device to operate the target device based on the control signal.
97. A method according to aspect 96 comprising any of the features, combinations of features and/or sub-combinations of features of any of aspects 1 to 95.
98. A method for interfacing with a target device comprising a display and a control system for operating the target device to provide the target device with touchless user input, the method comprising:
detecting a touch-free input corresponding to a gesture made by a human user and generating one or more corresponding input signals in response thereto;
providing a controller connected to receive the one or more input signals and generating, by the controller and based on the one or more input signals, a corresponding control signal; and
connecting the controller to the target device to bypass a touch-based input of the target device and to provide the control signal as an input to an existing control system of the target device and to thereby cause the control system of the target device to operate the target device based on the control signal;
wherein detecting the touch-free input comprises mounting a touchless sensing system comprising one or more sensors responsive to touchless input to a frame which extends at least partially around a perimeter of the display of the target system, so that the display of the target system is visible to the human user.
99. A method according to aspect 98 or any other aspect herein where the frame extends around the perimeter of the display of the target system, so that the display of the target system is visible to the human user through an aperture defined by the frame.
100. A method according to any one of aspects 98 or 99 or any other aspect herein wherein the controller is configured to generate, based on the one or more input signals, the corresponding control signal to emulate a signal of a corresponding input of the touch-based input of the target device.
101. A method according to any one of aspects 98-100 or any other aspect herein wherein mounting the touchless sensing system comprises mounting one or more capacitive sensors to the frame to extend at least partially around a perimeter of the display, the one or more capacitive sensors sensitive to changes in their electric fields caused by a human body part in proximity to the one or more capacitive sensors and the one or more capacitive sensors generating one or more corresponding capacitive sensor signals which form at least part of the input signals.
102. A method according to aspect 101 or any other aspect herein wherein mounting the touchless sensing system comprises mounting one or more optical sensors to the frame, the one or more optical sensors sensitive to electromagnetic radiation reflected from the human body part and the one or more optical sensors generating one or more corresponding optical sensor signals which form at least part of the input signals.
103. A method according to aspect 102 wherein generating, by the controller and based on the one or more input signals, the corresponding control signal comprises generating the corresponding control signal based on both the one or more capacitive sensor signals and the one or more optical sensor signals.
104. A method according to any one of aspects 98-103 comprising any of the features, combinations of features and/or sub-combinations of features of any of aspects 1 to 95.
105. A retrofit interface apparatus for retrofitting to a touchscreen of a target device, the apparatus comprising:
a touchless sensing system for receiving touch-free input from a human user and for generating a corresponding input signal;
a controllable switch located between and electrically connected to an electrical ground and a conductive film, the conductive film in physical contact with the touchscreen;
a controller connected to receive the input signal from the touchless sensing system and to generate, based on the input signal, a corresponding switch-control signal;
wherein the switch is connected to receive the switch-control signal and, in response to receiving the switch-control signal, the switch is operative to switch from a state where the conductive film is electrically disconnected from the electrical ground to a state where the conductive film is electrically connected to the electrical ground.

106. The apparatus according to aspect 105, or any other aspect herein, wherein the conductive film is made of a transparent material.

107. The apparatus according to any one of aspects 105 and 106 comprising a plurality of elements of transparent conductive film located at spaced apart locations in physical contact with the touchscreen and a plurality of switches connected to receive corresponding switch-control signals from the controller, each switch controllably operative, in response to receiving a corresponding switch control signal, to switch from a state where its corresponding conductive film is electrically disconnected from the electrical ground to a state where its corresponding conductive film is electrically connected to the electrical ground.

108. The apparatus of any one or aspects 105 to 107 or any other aspect herein comprising any of the features, combinations of features and/or sub-combinations of any of the aspects 1 to 95.

109. A method for retrofitting to a touchscreen of a target device, the method comprising:
  detecting a touch-free input corresponding to a gesture from a human user and generating a corresponding input signal in response thereto;
  providing a controllable switch located between and electrically connected to an electrical ground and a conductive film, the conductive film in physical contact with the touchscreen;
  receiving, at a controller, the input signal from the touchless sensing system and generating, by the controller and based on the input signal, a corresponding switch-control signal;
  in response to receiving the switch-control signal at the switch, switching the switch from a state where the conductive film is electrically disconnected from the electrical ground to a state where the conductive film is electrically connected to the electrical ground.

110. A method according to aspect 109 or any other aspect herein comprising any of the features, combinations of features and/or sub-combinations of any of the aspects 1 to 95.

111. A touchless sensing system for receiving input to control an apparatus comprising a display, the touchless sensing system comprising:
  one or more capacitive sensors which are sensitive to disturbances in their electric fields caused by a human body part in proximity to a user-facing sude of the display;
  one or more optical sensors located around the perimeter of the display and sensitive to changes in electromagnetic radiation reflected from the body of the user on the user-facing side of the display;
  a controller connected to receive one or more capacitive sensor signals from the one or more capacitive sensors and one or more optical sensor signals from the one or more optical sensors and configured to generate a control signal based on both the one or more capacitive sensor signals and the one or more optical sensor signals and to operate the apparatus using the control signal.

112. A system according to aspect 111 or any other aspect herein wherein at least a portion of the one or more capacitive sensors are located around a perimeter of the target device and are sensitive to disturbances in an their electric fields caused by a human body part in proximity to a user-facing side of the display in a middle of the perimeter.

113. A system n apparatus according to aspect 111 or any other aspect herein wherein at least one electrode of each of the one or more capacitive sensors is located on the user-facing side of a display of the target device, the at least one electrode of each of the one or more capacitive sensors fabricated from transparent conductive material, so that the human user can see the display of the target device through the at least one electrode of each of the one or more capacitive sensors.

114. A system according to aspect 113 or any other aspect herein wherein both electrodes of each of the one or more capacitive sensors are located on a user-facing side of a display of the target device and both of the electrodes of each of the one or more capacitive sensors is fabricated from transparent conductive material, so that the human user can see the display of the target device through the one or more capacitive sensors.

115. Apparatus having any new and inventive feature, combination of features, or sub-combination of features as described herein.

116. Methods having any new and inventive steps, acts, combination of steps and/or acts or sub-combination of steps and/or acts as described herein.

Further aspects and example embodiments are illustrated in the accompanying drawings and/or described in the following description.

BRIEF DESCRIPTION OF THE DRAWINGS

The accompanying drawings illustrate non-limiting example embodiments of the invention.

FIG. 1 illustrates a retrofit interface apparatus according to an example embodiment.

FIG. 8 schematically depicts an exploded view of a touchless sensing system comprising one or more capacitive sensors arranged and, optionally, one or more optical sensors arranged in a ring around a display which may be used as a portion of the feedback mechanism of any of the retrofit interface apparatus described herein according to a particular embodiment.

DETAILED DESCRIPTION

Figure 1A:
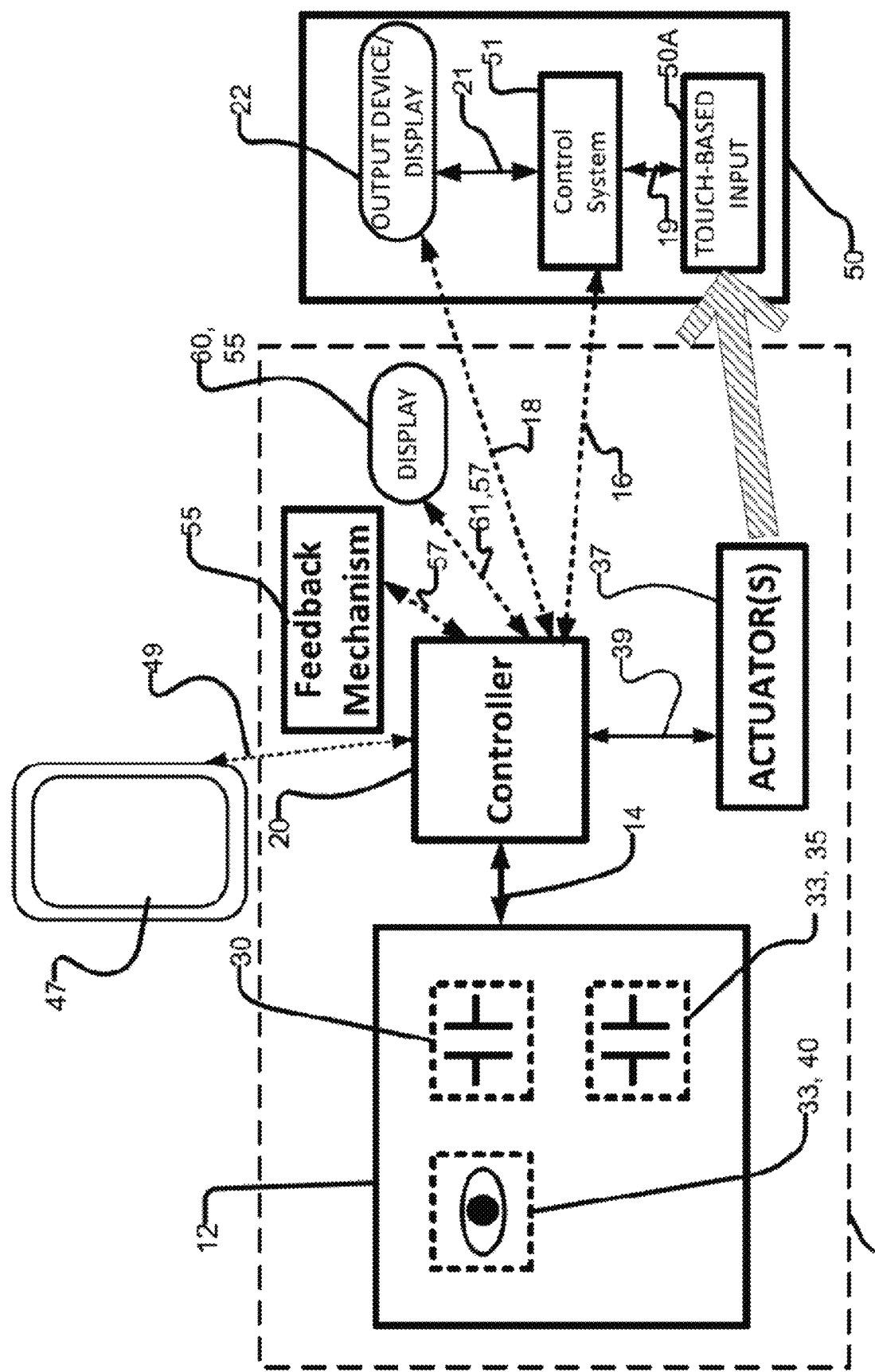
FIG. 1A illustrates a retrofit interface apparatus according to another example embodiment.

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive sense.

Aspects of the invention provide methods and apparatus for retrofitting to existing target devices equipped with target touch-based user input devices (e.g. touch-based HMIs) to provide touchless user input to such target devices.

Methods and apparatus are provided to retrofit to existing target devices equipped with target touch-based interfaces (or other target touch-based user inputs) to provide touchless user input functionality to the target device. As such target inputs are typically integrated into a given piece of equipment (the target device), retrofit interface apparatus, according to some embodiments, may be placed adjacent to or otherwise located relative to an existing (target) touch-based input to enable the retrofit interface apparatus to interact with at least a portion of the target touch-based input (e.g. a button, a knob, a handle, a slider and/or the like) as the user makes a touchless gesture (e.g. hover, point/tap, wave, etc.) to thereby provide input to the target device. In some embodiments, retrofit interface apparatus are connected to bypass the existing target touch-based input of the target device and to communicate directly with a control system of the target device. In some embodiments, retrofit interface apparatus are configured to emulate existing target touch-screen interfaces of the target device.

In general, retrofit interface apparatus according to particular embodiments may be retrofit to any suitable target device to provide the target device with touchless user input functionality. Example target devices and their target touch-based inputs include, without limitation: pedestrian controllers for street light signals, light switches and panels, intercom system keypads, payment (point of sale) terminals, ATMs (individual and in-bank units), elevator panels, parking meters/terminals, keypad locks, kiosks with touchscreens (e.g. airport check-in kiosks, retail store self-checkout kiosks, advertisement kiosks, hospital check-in kiosk and/or the like), computers, water faucets, water dispensers, lunchroom appliances, vending machines, gaming consoles, gaming controllers, casino slots and other gambling equipment, door handles, latches, knobs, industrial equipment, medical equipment, etc.

FIG. 1 schematically illustrates a retrofit interface apparatus 10 according to an example embodiment of the invention. Retrofit interface apparatus 10 retrofits to a target device 50 having a touch-based input 50A to provide target device 50 with touchless input functionality which may be used by a user (in addition to or in the alternative to touch-based input 50A) to provide input to target device 50. In the case of the illustrated FIG. 1 embodiment, retrofit interface apparatus 10 interfaces with a control system 51 of a target device 50 using control signals 16 and, optionally, with display 22 of target device 50 using display signals 18. Retrofit interface apparatus 10 comprises: a touchless sensing system 12 for detecting touch-free inputs (e.g. inputs corresponding to gestures made by a human user); and a controller 20 connected to receive input signals 14 generated by touchless sensing system 12. In some embodiments, input signals 14 may be generated upon touchless sensing system 12 detecting touch-free inputs from a user or otherwise determining that a user has made a touch-free input. That is, touchless sensing system 12 may comprise its own controller or internal logic circuitry (not shown) that interprets signals from the sensors of sensing system 12 and provides input signals 14 indicative of specific user input to controller 20. In some embodiments, such as in the case of the illustrated FIG. 1 embodiment, input signals 14 may be received by controller 20 and controller 20 may determine whether input signals 14 correspond to particular touch-free user inputs. Suitable signal conditioning circuitry (not shown) known to those skilled in the art, such as amplifiers, filters, MUXs and/or the like may be provided between touchless sensors of sensing system 12 and controller 20.

Controller 20 is connected to receive input signals 14 from touchless sensing system 12. Controller 20 may be configured (e.g. suitably programmed) to generate control signals 16 and/or display signals 18 for target device 50 based on input signals 14 received from touchless sensing system 12. Controller 20 may be operatively connected to control system 51 of target device 50 to provide control signals 16 to control system 51 to thereby cause control system 51 to operate target device 50 based on control signal 16. For example, controller 20 may be connected to control system 51 to deliver control signals 16 to control system 51 to thereby cause control system 51 to operate target device 50 based on touchless user input detected by touchless sensing system 12, such as a motion or an estimated location of the portion of the hand (e.g. finger) of the user. Control system 51 of target device 50 may use control signals 16 from controller 20 of retrofit interface apparatus 10 in addition to or in the alternative to control signals 19 from its own touch-based interface 50A to control the operation of target device 50.

Retrofit interface apparatus 10 may optionally comprise a display 60. Display 60 may be part of feedback mechanism 55 (discussed further below). Controller 20 may provide video signals 61 to display 60 to cause display 60 to display corresponding images, video, visual indicia and/or the like. In this manner, display 60 may provide users with some feedback about the state of retrofit interface apparatus 10 (e.g. whether retrofit interface apparatus 10 has detected a touchless input) and/or about the state of target device 50. In some embodiments, target device 50 may comprise its own display or some other form of output device 22 by which feedback about the state of target device 50 can be provided to users. For example, a target device 50 that is an elevator control panel may have an output device 22 that is a flat screen display (e.g. to show the next floor where the elevator car will stop) or may have an output device 22 that simply causes a corresponding floor button (or a portion of a button) that is pushed to be illuminated. For brevity, output device 22 of target device 50 may be referred to herein as display 22 and, unless the context dictates otherwise, such references should be understood to include any suitable form of output device 22.

Control system 51 of target device 50 may control target device display 22 via suitable display signals 21. In some embodiments, controller 20 of retrofit interface apparatus 10 may optionally be additionally or alternative connected to display 22 of target device 50 to provide output signals 18 to display 22 to thereby cause display 22 to display corresponding images, video, visual indicia and/or the like based on display signals 18. In some embodiments, controller 20 of retrofit interface apparatus 10 may provide control signals 16 to control system 51 of target device 50, which may in turn cause control system 51 to cause display 22 to display corresponding images, video, visual indicia and/or the like (e.g. via display signals 21).

Touchless sensing system 12 comprises one or more sensors for detection of touchless user input. In some embodiments, touchless sensing system 12 of retrofit interface apparatus 10 and/or other retrofit interface methods and apparatus described herein comprises one or more capacitive sensors 30 that are sensitive to (i.e. have a capacitance which varies with) the electric field in the proximity of the sensor. For example, a gesture (e.g. a tap, movement of the fingers, etc.) made by a user may cause corresponding variation in the electric field in proximity to a capacitive sensor 30 and may thereby cause a detectable change in the capacitance of sensor 30. For simplicity, a single capacitive sensor 30 is shown in FIG. 1, but it will be understood that touchless sensing system 12 may comprise a plurality of suitably arranged capacitive sensors 30. Advantageously, capacitive sensors 30 may facilitate accurate short-range detection of touchless user interaction events (e.g. hand-gestures, finger gestures and/or the like).

In some embodiments, capacitive sensors 30 are fabricated or otherwise supported on a printed circuit board (PCB) (not shown). The PCB may comprise a multi-layered PCB. In some embodiments, one surface or layer of the PCB (known as a receiving surface or receiving electrode) may be exposed to the object to be sensed (e.g. a finger or hand of a user). In some such embodiments, this PCB receiving surface or receiving layer is not directly exposed, but rather is covered by a protective layer of non-conductive material. Each capacitive sensor 30 may comprise a pair of electrodes (transmit and receive electrodes), between which an electric field is established. In some embodiments, a plurality of capacitive sensors 30 may be provided by a single transmit electrode and a plurality of receive electrodes (or vice versa). The transmit electrode may be located relatively more distal from the user than the receive electrode (e.g. at a layer relatively more distal from the user than the first layer of the PCB). A layer of non-conductive material may be located between the transmit electrode(s) and the receive electrode(s) to electrically isolate the transmit electrodes and the receive electrodes.

In operation, an object that is desired to be sensed by touchless sensing system 12 (e.g. a part of the human body) causes a disturbance to the electric field between the transmit electrodes and the receive electrodes of capacitive sensors 30, when the object is located or brought into proximity to capacitive sensors 30, thereby changing the capacitance of sensors 30. Each capacitive sensor 30 may comprise suitable circuitry (not expressly shown) which causes sensor 30 to output a signal m (e.g. input signal 14) that is dependent on the capacitance between its receive and transmit electrodes and which in turn is dependent on the location of a body part (e.g. a hand or finger) of the user. This allows capacitive sensors 30 of touchless sensing system 12 to be used (e.g. by a suitably configured controller such as controller 20 of retrofit interface apparatus 10, an internal controller (not shown) of capacitive sensors 30 or touchless sensing system 12, and/or the like) to detect and track movement of a body part (e.g. hand or finger) of the user. With a suitably located array (plurality) of capacitive sensors 30 and a corresponding plurality of output signals, a machine learning algorithm can be trained to infer location characteristics about the body part of the user. It will be appreciated that the output signals from sensors (including capacitive sensors 30) can be interpreted by any suitable combination of one or more controllers, which may include controller 20 of retrofit interface apparatus 10, an internal controller (not shown) of capacitive sensors 30 or touchless sensing system 12, and/or the like.

For some HMI applications, capacitive sensors 30 may provide the following non-limiting advantages over other types of sensors (e.g. a 3D camera sensor) to facilitate touchless input detection: the detection range of capacitive sensors 30 is focused in a range around several centimeters; firmware-level algorithms are tunable to detect a single point of interest (e.g. the center of mass of a conductive object such as the finger of a user); ambient factors (e.g. light, background motion, etc.) have limited effects on functionality; capacitive sensors 30 do not give rise to privacy concerns in the same manner as camera-based sensors. Such advantages allow capacitive sensors 30, when compared to other types of sensors, to be used (e.g. by a suitably configured controller such as controller 20 of retrofit interface apparatus 10, an internal controller (not shown) of capacitive sensor 30 or touchless sensing system 12 and/or the like) to provide more consistent and/or more accurate estimates of the types of user gestures that would typically be used to interact touchlessly with retrofit interface apparatus 10.

The layout arrangement, size and/or shape of the receive electrodes and/or the transmit electrodes of capacitive sensors 30 may be customized (e.g. on a PCB). In some embodiments, the receive electrodes of capacitive sensors 30 are arranged in a spaced apart array, where each receive electrode's signal is based on the proximity of a human body part (e.g. finger). Capacitive sensors 30 and/or sensing system 12 may comprise internal controllers suitably configured (e.g. programmed with) signal processing algorithms that utilize these signals (from each receive electrode) to determine the position (e.g. three-dimensional x, y, z coordinates; a suitable subset or representation of these coordinates; and/or the like) of a portion of a conductive part of the user's body (e.g. the finger tip). In some embodiments, controller 20 is suitably configured (e.g. programmed) with these signal processing algorithms to determine the position of the conductive part of the user's body. The shape and/or size and/or location of each receive electrode of capacitive sensors 30 can be designed based on, for example, whether touchless sensing system 12 is wired or battery powered, the desired detection range, the desired detection accuracy and/or or mechanical constraints.

In some embodiments, the layer of the PCB supporting the transmit electrode(s) comprises an expansive layer of copper and/or a hatched layer of copper (e.g. "criss-cross" copper traces) with dimensions (e.g. x- and y-dimensions in the plane of the PCB) slightly greater than the corresponding x- and y-dimensions of the receive electrodes.

Figure 2:
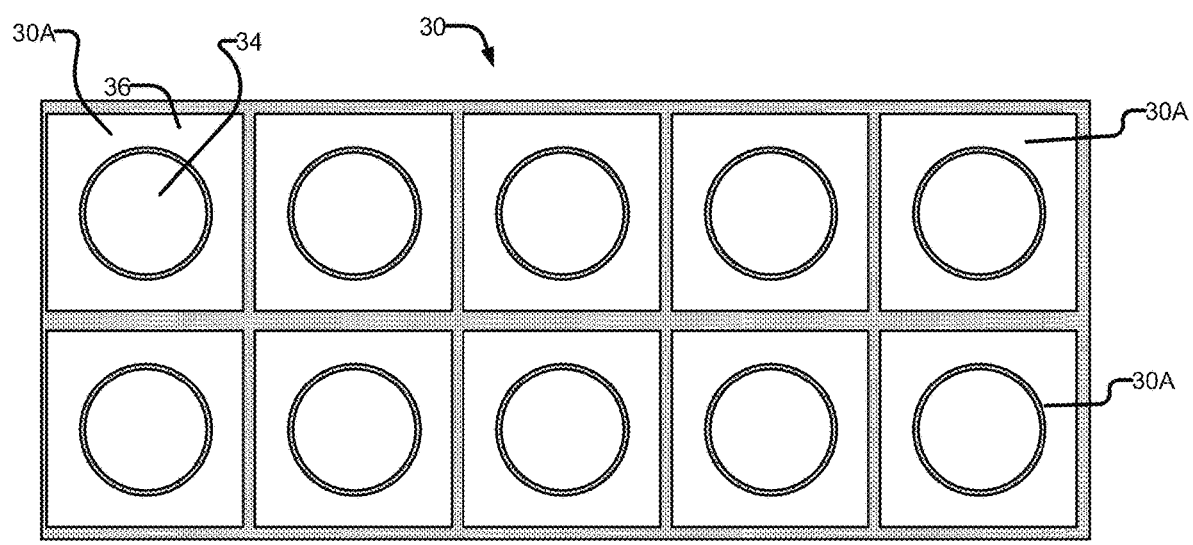
FIG. 2 schematically illustrates an array of capacitive sensors which may be used in the touchless sensing system of any of the retrofit interface apparatus described herein according to an example embodiment.

In some embodiments, the receive electrodes and the transmit electrodes of capacitive sensors 30 are arranged (e.g. paired off) in rectangular cells in a concentric configuration, a schematic illustration of which is shown in FIG. 2. In the FIG. 2 embodiment, capacitive sensors 30 comprise an array of individual capacitive sensors 30A, each of which comprises a receive electrode 36 and a transmit electrode 34. For each individual sensor 30A, receive electrode 36 surrounds the transmit electrode 34, or, in an alternative arrangement the transmit electrode 34 surrounds the receive electrode 36. In such embodiments, each cell 30A (i.e. each individual capacitive sensor 30A) is connected to a controller (e.g. such as an internal controller of capacitive sensors 30 or touchless sensing system 12 (not shown), controller 20 of retrofit interface system 10 and/or the like) via suitable signal conditioning circuitry (e.g. amplifiers, filters, digital to analog converters, multiplexers and/or the like) to output a unique capacitive detection signal (e.g. a signal from each receive electrode 36). In such embodiments, the voltage applied (e.g. to the transmit electrode) to each cell 30A may be configured to control an electric-field output corresponding to the cell 30A. This independent control of the electric fields of individual cells 30A allows the shape and boundaries of the overall sensor electric field of capacitive sensor 30 to be precisely controlled. For example, each receive electrode 36 of each cell 30A of capacitive sensor 30 can be individually scanned to obtain a series of precise measurements. Advantageously, such modular design (with independent control of each cell 30A) provides good scalability due to its modular cell design (i.e. such design can be expanded to large sizes (e.g. by increasing the number of cells 30A) and can be shaped (e.g. by suitable location of cells 30A) while maintaining a tolerable detection/sensitivity volume).

In some embodiments, capacitive sensors 30 are located and/or oriented for detecting one or more location characteristics and/or movement characteristics (e.g. velocity, acceleration and/or directions associated with such velocity and/or acceleration) of a part of the body of the user or other conductive object—typically a center or mass or a centroid of the body part or other conductive object. It will be appreciated that suitable digital or analog signal processing (e.g. taking derivatives) may be used to obtain movement characteristics from location characteristics. Accordingly, location characteristics and/or movement characteristics of a centroid of a body part or other conductive object may be determined by capacitive sensor 30 in cooperation with a suitably configured controller and/or signal processing hardware, such as controller 20 of retrofit interface apparatus 10, an internal controller (not shown) of capacitive sensor 30 or touchless sensing system 12 and/or the like). For brevity, the remainder of this disclosure refers to location characteristics, it being understood that, unless the context dictates otherwise, such location characteristics include movement characteristics, which may be derived from the location characteristics or independently detected. For brevity, this disclosure may refer to touchless sensing system 12 and/or its sensors (e.g. capacitive sensor 30 or any other sensors) performing particular actions (e.g. determining characteristics, detecting characteristics, sensing characteristics, generating signals and/or information and/or the like). Unless the context dictates otherwise, it should be understood that such sensors may cooperate with one or more suitably configured controllers and/or signal processing hardware, such as controller 20 of retrofit interface apparatus 10, an internal controller (not shown) of the sensors or touchless sensing system 12 and/or the like, to perform such actions.

The location characteristics may correspond to a gesture. For example, the location characteristics may comprise a location of a body part (e.g. a centroid of finger, hand, fist, wrist, forearm, etc.) of the user as the user makes a gesture with the body part. Unless context dictates otherwise, the term "gesture" (as used herein) refers to a position, movement and/or configuration made by a body part of the user and should not be construed as limited to hand gestures. By way of non-limiting example, capacitive sensor 30 may be configured to detect hand gestures, finger gestures, an angle of movement (e.g. approach) of a body part relative to sensor 30, a position of a body part and/or the like. Such location characteristics may be used (e.g. by controller 20) to determine particular touchless inputs to target device 50. For example, where touch based interface 50A comprises a series of input buttons (e.g. like an elevator control panel), such location characteristics may be used to determine a touchless input representing the selection (e.g. pushing) of one such button.

In some embodiments, controller 20 is configured, based on input signals 14, to detect location characteristics comprising a circular motion made with a portion of the user's hand and to generate a control signal (e.g. control signal 16, control signal 39 (described further below) or control signal 43 (described further below)) that effects operation of target device 50 based on the detected circular motion. In some embodiments, controller 20 is configured, based on input signals 14, to detect location characteristics comprising a portion of the hand of the user lacking motion (to within a threshold) for a threshold period of time and to generate a control signal (e.g. control signal 16, control signal 39 (described further below) or control signal 43 (described further below)) that effects the operation of target device 50 based on the detected lack of motion. In some embodiments, controller 20 is configured, based on input signals 14, to detect location characteristics comprising a proximity of a portion of a user's hand to a portion of display 60 or display 22 (e.g. for a suitable period of time) and to generate a control signal (e.g. control signal 16, control signal 39 (described further below) or control signal 43 (described further below)) that effects the operation of target device 50 based on the proximity of the portion of the user's hand to the portion of display 60 or display 22. In some embodiments, controller 20 is configured, based on input signals 14, to detect location characteristics comprising a proximity of a portion of a user's hand to a portion of some other generally planar surface, such as that of a panel showing icons, virtual buttons and/or the like (e.g. for a suitable period of time) and to generate a control signal (e.g. control signal 16, control signal 39 (described further below) or control signal 43 (described further below)) that effects the operation of target device 50 based on the proximity of the portion of the user's hand to the portion of the other planar surface.

Touchless sensing system 12 may optionally comprise one or more additional sensors 33 (e.g. a second set of one or more capacitive sensors 35, one or more optical sensors 40 as described in more detail elsewhere herein, etc.) located and/or oriented for detecting one or more secondary characteristics. Such secondary characteristics may be different from (i.e. additional to or alternative to) the location characteristics detected by capacitive sensors 30, although this is not necessary. Such secondary characteristics may comprise secondary location characteristics (and/or secondary movement characteristics) of a part of the user's body. Such body part may be different than the body part associated with the primary location characteristics, although this is not necessary. The secondary location characteristics may correspond to secondary gestures of a body part. Such additional sensors 33 may generate secondary location sensor signal(s) upon detecting the secondary location characteristics of the body of the user.

Examples of secondary characteristics include, but are not limited to, the volume, shape, location and/or angle of movement (e.g. approach) of a part of the body of a user making a gesture which may comprise a touchless input to retrofit interface apparatus 10 that may in turn be used to effect control of target device 50.

Additional sensor 33 may be located adjacent to first capacitive sensors 30. First capacitive sensors 30 and additional sensors 33 may have different detection ranges or may have other detection characteristics that are different from one another. For example, additional sensors 33 may have a detection range that is wider (e.g. in an x-y plane corresponding to the PCB on which capacitive sensors 30 are embodied) and/or more far-reaching (e.g. in a z direction orthogonal to the x-y plane) than the detection range of first capacitive sensors 30. In some embodiments, a significant portion (e.g. 75%, 90% or 100%) of the detection range of first capacitive sensors 30 is located within the detection range of additional sensors 33. In other embodiments, the detection range of first capacitive sensor 30 and the detection range of additional sensor 33 are non-overlapping.

In some embodiments, input signals 14 (from touchless sensing system 12 to controller 20) include both the location sensor signals generated by the first capacitive sensors 30 and the secondary sensor signals generated by additional sensor 33. In some embodiments, controller 20 receives input signals 14 from first capacitive sensors 30 and additional sensors 33 and controller 20 is configured to determine location characteristics and/or secondary location characteristics. Controller 20 may be configured to generate control signals 16 and/or display signals 18 based on either one or both of the location sensor signals from capacitive sensors 30 and the secondary sensor signals from additional sensors 33.

In some embodiments, controller 20 is configured to determine location characteristics of a body part of a user based on signals 14 from both capacitive sensors 30 and additional sensors 33. For example, controller 20 may be configured to process (e.g. scale, filter, weight, otherwise modify, interpret, calibrate and/or the like) the information from capacitive sensors 30 based on the information from additional sensors 33. In some embodiments, controller 20 is configured to determine the presence of a user in a vicinity of target device 50 based on the secondary sensor signal (from additional sensors 33). Controller 20 may be configured to calibrate the location sensor signals 14 from capacitive sensors 30 based on determination of the presence or lack of presence of a user in the vicinity of target device 50. Controller 20 may be otherwise configured to calibrate the location sensor signals 14 from capacitive sensors 30 based on location characteristics detected by additional sensors 33 and/or based on output signals generated by such additional sensors 33.

Retrofit interface apparatus 10 and/or other retrofit interface methods and apparatus described herein may, according to some embodiments, comprise voice detection technology (e.g. Alexa™, Google™ and/or the like) that includes a microphone (e.g. as an additional sensor 33) and suitable voice-detection algorithms (which may be programmed into controller 20 and/or a separate controller—e.g. by training suitable machine learning or artificial intelligence software). Such voice-detection technology could be used in addition to or in the alternative to touchless capacitive sensors 30. Such voice-detection technology could be included as part of touchless sensing system 12 (e.g. as an additional sensor 33) and/or as part of retrofit interface apparatus 10 generally. Such voice detection could be used, by way of example, to input a buzzer number, name, license plate, elevator floor number, door lock code, etc.

In some embodiments, retrofit interface apparatus 10 and/or other retrofit interface methods and apparatus described herein may comprise an optical sensing system 40. Optical sensing system 40 may be embodied as part of touchless sensing system 12 (e.g. as an additional sensor 33) as shown in FIG. 1, although this is not necessary and optical sensing system 40 may be a stand-alone component of retrofit interface apparatus 10. Optical sensing system 40 may comprise one or more optical sensors (e.g. a thermal camera, an infrared camera, an RBG camera, a time-of-flight camera, a stereoscopic camera, a structured light camera, a 3D camera, etc.). Such optical sensors may be sensitive to changes in electromagnetic radiation reflected from a body part of the user (e.g. changes caused by a gesture made by the user).

Advantageously, optical sensing system 40 may be configured to enable controller 20 to calibrate and, thereby obtain more accurate location characteristics of a user's body part (e.g. finger) when compared to using capacitive sensors 30 alone. Optical sensing system 40 may detect any of a variety of characteristics of a body part (e.g. size and shape, left/right hand, fist/forearm position, angle of hand, etc.) that may be used (e.g. by controller 20) to calibrate or otherwise compensate the information from capacitive sensors 30. By way of non-limiting example, optical sensor 40 might be used to ascertain that: a user is particularly tall (and hence they might be angling their finger downwardly when interacting with capacitive sensors 30); a user's forearm is relatively close to capacitive sensors 30 (and hence might have an impact on the amplitude of signals received from particular capacitive sensors 30 or that an estimation of a center of mass of the object in the sensing volume may be biased toward the user's forearm as opposed to their fingertip and could or should be compensated); a user is approaching or interacting with the sensing volume of capacitive sensors 30 with their left or right hand (which may cause controller 20 to use a different left/right hand machine-learning inference engine to predict location characteristics of the user's finger); and/or the like.

In some embodiments, controller 20 (and/or an additional controller (not shown) associated with touchless sensing system 12) comprises a machine learning data-trained model (e.g. a neural network model) trained to use location sensor signals (e.g. signals generated by capacitive sensors 30) and secondary sensor signals (e.g. signals generated by optical sensing system 40 and/or second capacitive sensors 35 and/or some other additional sensors 33) to determine location characteristics of a body part of the user. Such location sensor signals and secondary sensor signals may be part of input signals 14. Controller 20 may be configured to generate control signals 16 and/or display signals 18 based on the location characteristics determined from the location sensor signals and/or the secondary sensor signals. For example, controller 20 may be configured to select control signal 16 from among a plurality of potential control signals based on the location characteristics determined from such location sensor signals and/or secondary sensor signals.

In some embodiments, optical sensing system 40 is configured to detect or otherwise confirm the user's presence (or the lack of presence) in a vicinity of retrofit interface system 10 and/or target device 50. In such embodiments, after detection of the presence of a user, capacitive sensors 30 may be configured to record a noise level measurement and controller 20 can perform a system calibration (e.g. of capacitive sensors 30 and/or of other sensors of touchless sensing system 12 generally) based on the measured background noise.

Optical sensing system 40 may optionally comprise one or more lasers for emitting laser radiation (e.g. infrared laser light, near-infrared laser or other visible light) and one or more detectors (e.g. photodetectors) for detecting the emitted laser radiation. For example, optical sensing system 40 may comprise a detector located to receive laser radiation reflected from a body part (e.g. a body part making a gesture) of the user. Optical sensing system 40 may comprise suitable optics located to receive the emitted (e.g. reflected) laser radiation. In some embodiments, the one or more lasers of optical sensing system 40 may be adapted for use as the primary sensor of retrofit interface apparatus 10—e.g. optical sensing system 40 may be used in the place of capacitive sensors 30 described herein.

In some embodiments, optical sensing system 40 is configured to generate a 2-dimensional plane of laser radiation which may be referred to herein as a detection plane. The 2-dimensional detection plane may have a normal vector that is substantially parallel (e.g. to within 10° or 15°) to a normal vector of: a plane of display 60 (of retrofit interface apparatus 10) or display 22 (or target device 50); a plane tangential to an external surface of display 60 or display 22; and/or to a plane tangential to some other surface of target device 50 and/or of retrofit interface apparatus 10 (e.g. a plane on which icons, virtual buttons or the like are displayed). This 2-dimensional detection plane may be located adjacent to (but spaced apart from): the plane of display 60, 22, the plane tangential to display 60, 22 and/or the plane tangential to the surface of target device 50 and/or of retrofit interface apparatus 10. In some embodiments, this 2-dimensional detection plane may be located adjacent to (but spaced apart from) some other generally planar surface (e.g. a panel adorned with images of icons or the like). Locations on this 2-dimensional detection plane may be characterized by a pair of suitable coordinates (e.g. a Cartesian set of orthogonal x and y-coordinates). Controller 20 may be configured to estimate an x-coordinate and a y-coordinate of a body part of the user based on a secondary sensor signal (e.g. a signal generated by optical sensing system 40) indicating a location at which the body part has intersected the 2-dimensional detection plane.

Optical sensing system 40 may be located adjacent to (or at some other suitable location relative to) capacitive sensors 30. Optical sensing system 40 may be configured to detect the intersection of a user's body part (e.g. finger) at a location (e.g. at x and y-locations on a detection plane) located configurable distance (i.e. in a z-direction orthogonal to the x-y directions) away from capacitive sensors 30, display 60, display 22 and/or some other generally planar surface. Optical sensing system 40 may be configured to detect the transverse x-coordinate and y-coordinate of a user's finger as the finger intersects the detection plane during its approach toward capacitive sensor 30 and/or the surface of display 60, display 22 and/or some other generally planar surface, while capacitive sensors 30 may detect an orthogonal z-coordinate of the finger during the finger's approach toward the detection plane (e.g. before and/or after the finger intersects the detection plane of the optical sensor 40). Capacitive sensors 30 may also detect transverse (x-y) coordinates of the finger (or other body part), but the transverse coordinates measured by capacitive sensors 30 may be relatively coarse relative to the transverse coordinates detected by optical sensing system 40. Such x- and y-coordinates detected by optical sensing system 40 may be associated with selection of a particular input (e.g. a virtual button) which may be displayed at particular x- and y-coordinates on display 60, display 22 and/or some other generally planar surface. The detection of the z-coordinate may help touchless sensing system 12 to anticipate the user's upcoming selection. By way of non-limiting example, the z-coordinate may be used by controller 20 as part of a "virtual click" detection algorithm (e.g. to ascertain if a user is trying to touchlessly press or click a virtual button or whether the user's body part is merely lingering around in a sensing volume of sensing system 12). Such detection of user-interaction with virtual buttons is discussed further below. As another example, the z-coordinate may be used to provide feedback to a user (e.g. via a suitable feedback mechanism 55) to indicate that the user's body part is being detected. Capacitive sensors 30 and their ability to detect x, y and z coordinates may be used to determine an angle of approach to a detection plane. This angle of approach may be used in conjunction with more precise transvers (x-y) information from optical sensing system 40 as part of a "virtual click" detection algorithm. Such detection of user-interaction with virtual buttons is discussed further below.

Optical sensing system 40 may comprise a number of optional features that may be used to control the spatial location and/or orientation of its 2-dimensional detection plane. For example, optical sensing system 40 may comprise one or more laser emitters which may be located beside a plane of (or a plane tangential to) display 22 or touch based input 50A or some other suitable surface of target device 50 and/or retrofit interface apparatus 10 and may be oriented to direct radiation in a direction that is parallel with the normal of such a plane. In such implementations, optical sensing system 40 may optionally include one or more mirrors (optimized for reflection of the emitted radiation) oriented at about a 45° angle relative to the emitted laser radiation direction to reflect the laser radiation to a direction that is at about a 90° angle relative to the radiation emission direction to form a detection plane that is parallel to the plane of (or a plane tangential to) display 22 or touch based input 50A or some other suitable surface of target device 50 and/or retrofit interface apparatus 10. Optical sensing system 40 may include different combinations of mirror shapes/sizes and/or different placement angles and/or different combinations of other optical elements (e.g. lenses, waveguides and/or the like) to provide the desired detection plane at the desired location and/or orientation. Optical sensing system 40 may comprise a commercially available laser-based optical sensors such as the Neonode™ zForce Sensor™.

Figure 3A:
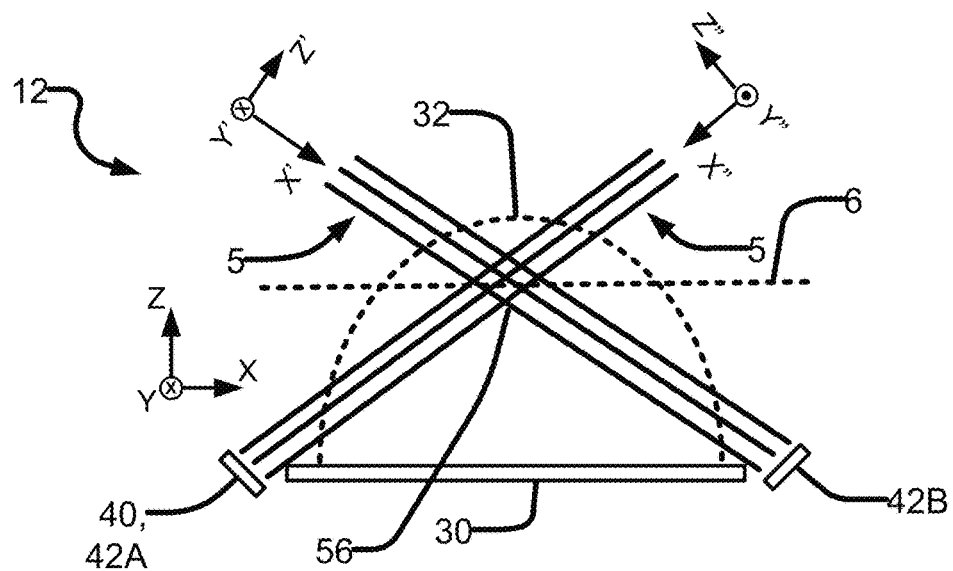
FIGS. 3A-3C schematically illustrate a touchless sensing system comprising one or more capacitive sensors and an optical sensing system comprising a plurality (e.g. two) of optical sensors which may be used with any of the retrofit interface apparatus described herein according to a particular example embodiment.
Figure 3B:
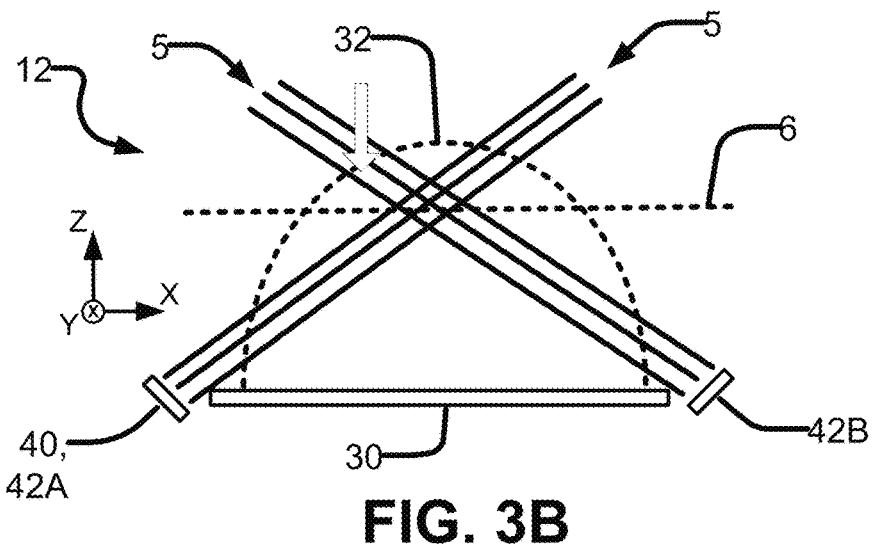
Figure 3C:
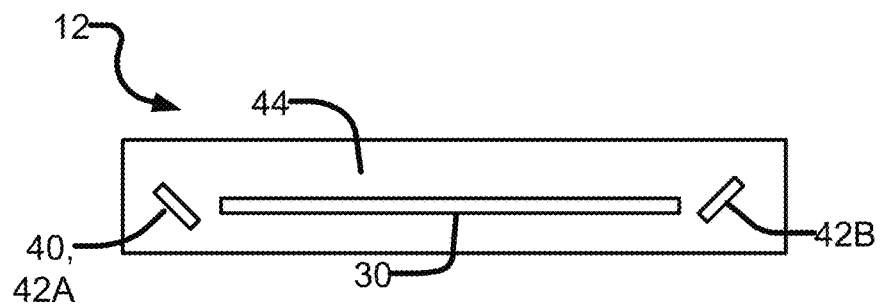

FIGS. 3A-3C schematically illustrate a touchless sensing system 12 comprising one or more capacitive sensors 30 and an optical sensing system 40 comprising a plurality (e.g. two) optical sensors 42A, 42B (collectively, optical sensors 42) which may be used with retrofit interface apparatus 10 (FIG. 1) and/or other retrofit interface methods and apparatus described herein according to a particular example embodiment. In the illustrated embodiment of FIG. 3A-3C, optical sensors 42A, 42B are optically oriented to direct radiation toward (or so as to intersect with) a sensing region 32 of capacitive sensors 30. In the example embodiment shown in FIGS. 3A-3C, optical sensors 42 each comprise a radiation source for emitting radiation and a radiation receiver (e.g. a photodetector, a receiving diode, etc.) for receiving radiation reflected from any object in the path of the emitted radiation. Unless context dictates otherwise, the term "optically oriented" (as used herein) should be interpreted to imply that optical sensors 42 (or other sensors of optical sensing system 40) described herein may comprise any number (e.g. 0, 1, 2, 3, etc.) of suitable optical elements (e.g. lenses, mirrors, waveguides, etc.) located to shape, locate and/or orient radiation from a radiation source in the direction of optical orientation.

As shown using the Cartesian axes shown in FIG. 3A, radiation sensors 42, together, may be oriented or otherwise configured to detect the x-position and the y-position of an object (e.g. a finger) relative to a coordinate system of capacitive sensors 30. For example, in the illustrated embodiment shown in FIG. 3A, sensor 42B is capable of detecting an x'-position and a y'-position (see x', y', z' axes in FIG. 3A) and sensor 42A is capable of detecting an x"-position and a y" position (see x", y", z" axes in FIG. 3A). With either or both these detected positions (x', y') and (x", y"), a suitable geometric calculation may be used (e.g. by controller 20 and/or a controller associated with optical sensors 42 or touchless sensing system 12) to determine an x-position and a y-position in the coordinate frame of capacitive sensors 30 (see x, y, z-axes in FIGS. 3A, 3B). That is, optical sensing system 40 may be configured to determine the transverse (x-y) location of the object relative to capacitive sensors 30 based on the transverse (x'-y') and/or (x"-y") locations detected by the optical sensors 42.

As described above, optical sensing system 40 (e.g. optical sensors 42) can accurately determine the x-position and the y-position of an object (e.g. a finger) relative to capacitive sensor 30, whereas capacitive sensor 30 can accurately detect the distance of the object relative to capacitive sensor 30 (i.e. the z-position of the object in the coordinate frame of capacitive sensor 30). In this manner, optical sensing system 40 and capacitive sensors 30 may complement one another. When an object such as a human finger enters a detection zone 5 of optical sensing system 40 (e.g. intersects with one or more detection planes 6 of touchless sensing system 12 shown in FIG. 3B or otherwise enters optical sensor detection zone 5) defined by optical sensors 42 (see FIG. 3B), optical sensing system 40 can be configured to determine the x-position and the y-position of the object relative to capacitive sensor 30 based on information from radiation emitting sensors 42.

Since the detection zone 5 of optical sensors 42 may be different from the sensing region 32 of capacitive sensor 30, the x-position and y-position of the object may, in some cases, be determined first and tracked or temporarily stored until the object comes within the sensing region 32 of capacitive sensor 30 and/or until the object intersects with a detection plane 6 of touchless sensing system 12. In some embodiments, the z-position of the object is detected by capacitive sensor 30 after the x-position and y-position of the object are determined by optical sensing system 40. In other embodiments, the z-position of the object is detected by capacitive sensor 30 before the x-position and y-position of the object are determined by optical sensing system 40. In some embodiments, touchless sensing system 12 is configured to register the x-position and the y-position of the object (detected by optical sensing system 40) after the z-position of the object reaches a configurable threshold distance from capacitive sensor 30 and/or from some other reference surface, such as the surface of display 22 (or a plane tangential to display 22). For example, touchless sensing system 12 may be configured to register the x-, y-positions when the object intersects with detection plane 6. This threshold z-distance (at which the x-, y-positions are registered) can be evaluated by capacitive sensor 30. In some embodiments, controller 20 or some other controller associated with touchless sensing system 12 may be configured to make decisions (e.g. detection of a particular gesture or a gesture based on the registered x-, y-positions.

In some embodiments, actuation plane 6 is defined at a fixed location relative to capacitive sensor 30 and/or from some other reference surface, such as the surface of display 22 or a plane tangential to display 22—e.g. at a distance corresponding to the location where radiation 5 emitted by optical sensors 42A, 42B intersects). In other embodiments, the location of actuation plane 6 can be adjusted by suitable programming (or user configuration) of controller 20 or some other controller associated with touchless sensing system 12.

FIG. 3C schematically illustrates an exemplary arrangement of capacitive sensors 30 and optical sensing system 40 according to a particular embodiment. In the example shown in FIG. 3C, touchless sensing system 12 comprises a plurality (e.g. two) of optical sensors 42A, 42B (collectively, optical sensors 42) optically oriented to emit radiation from locations that may be in the same plane as capacitive sensors 30. In some embodiments, optical sensors 42 and capacitive sensors 30 are formed as part of an integrated module (e.g. as part of a thin slate having a shape like that of a tablet device). In some embodiments, optical sensors 42 and capacitive sensors 30 are encapsulated in a medium 44, such as resin to fix the relative locations of optical sensors 42 and capacitive sensors 30. Medium 44 may be transparent at the wavelength of optical sensors 42. In some embodiments, medium 44 can provide an optical element in the path of radiation emitted by (and/or received by) optical sensors 42 to shape, locate and/or orient such radiation. Medium 44 may comprise glass or quartz. In some embodiments, capacitive sensors 30 are formed using transparent conductive material, such as Indium Tin Oxide (ITO), and located in a glass medium 44 and optical sensors 42 are oriented at a desired angle behind the glass. Advantageously, glass medium 44 may be used to encase capacitive sensors 30 and optical sensing system 40 to form a flat (non-protruding) design that can be flush mounted in another surface (e.g. a wall or horizontal surface). This flush mounting contrasts with prior art optical designs which protrude away from the surface (wall or horizontal surface in or on which they are mounted). This flush design can prevent tampering with retrofit interface apparatus, for example.

Referring to FIGS. 3A-3C, in some embodiments second capacitive sensors 35 (not shown in FIGS. 3A-3C) can be positioned adjacent to first capacitive sensors 30 and oriented to sense a user's hand that is interacting with first capacitive sensors 30. Second capacitive sensors may then detect a second distance estimate (coordinate), which provides another degree of information regarding the object (hand/finger) relative to first capacitive sensors 30. This information, along with the known orientation of second sensors, may be used to help determine the orientation of the hand/finger, which may provide additional information useful to discern a particular input (e.g. a particular virtual button) with which the user is trying to interact.

Additional optical sensors (not shown in FIGS. 3A-3C) can be deployed by stacking up on the existing optical sensors 42A, 42B to give more coverage and accuracy of the detected object. The additional optical sensors can be utilized to determine the orientation of the object and provide additional depth information for further analysis. One can imagine differently angled optical sensors being triggered at different points of the finger's motion toward a virtual button or other touchless input. This would allow for a 'lap-vector' or trajectory to be determined and this information could be used to determine which virtual button the user is attempting to select. For example, the finger may be positioned above a virtual button corresponding to a '2', but pointing to the right, and so controller 20 could be configured (by suitable software) to determine that the user meant to click '3' if the angle of the tap-vector is sufficient. In addition or as an alternative to providing more optical sensors (e.g. in addition to optical sensors 42A, 42B), other sensors and techniques can be used for determining a "tap-vector". Such additional or alternative techniques may include, without limitation, determining a tap-vector based on first and second 3-dimensional location estimates based on information from capacitive sensors (e.g. upon detecting the crossing of first and second threshold distances (z-coordinate distances) away from a plane of the virtual button). It is noted in this regard that capacitive sensors can detect transverse (x, y) coordinates, although these transverse coordinates may be less precise than those detected by optical sensors 40. Such additional or alternative techniques may include, without limitation, determining a tap-vector based on a first 3-dimensional detection based on information from capacitive sensors 30 (e.g. upon detecting the crossing of a first threshold (z-coordinate) distance away from a plane of the virtual button) and a second 3-dimensional detection based on transverse information (x, y) coordinates based on information from optical sensors 40 and a z-coordinate determined by capacitive sensors 30. In any of these tap-vector estimation techniques, a suitable temporal threshold may be used as another criteria associated with discriminating a tap.

Optical sensors 40 (e.g. like sensors 42A, 42B) can detect multiple points at once. A user's intention to work with either multiple points or a single point can be determined within a threshold timeframe of an object entering the optical sensors' detection region. Depending on how many points are detected within a threshold timeframe, optical sensors 40 can enter a single point or multipoint operational mode. Multipoint accuracy may perform better with additional optical sensor(s) (i.e. in addition to sensors 42A, 42B shown in FIGS. 3A-3C), as described above. Multipoint detection can be used for two-finger gestures like pinch-to-zoom and pinch-to-pan.

Further improvement in range and accuracy of optical sensors 40 (e.g. optical sensor 42A, 42B) can be achieved by having the optical sensor's detection-planes oscillate between a range of angles (e.g. using a rotary actuator or the like). Such oscillating detection planes allow the optical sensors themselves to have depth (z direction) information in addition to z-direction information obtained from capacitive sensor 30. Such oscillating detection planes also allow obtaining transverse x-y position at different object depths (i.e. at different z coordinates) as opposed to at a fixed depth.

In some embodiments, controller 20 is configured to estimate a line-of-sight vector of the human user and/or the distance between the human user and display 60 based on input signals 14 from touchless sensing system 12. Controller 20 may be configured to estimate the line-of-sight vector based on an estimate of the position of a portion of the hand (e.g. fist, wrist, forearm, etc.) of the user and/or an estimate of the angle of approach of the portion of the hand of the user. The line-of-sight vector could also, in some cases, be estimated based on the location of the user's head/torso. Information for making such line-of-sight estimates may be provided by touchless sensing system 12.

The user's line-of-sight and/or location can in some cases be detected by using an additional line-of-sight sensor (e.g. a capacitive sensor, optical sensor, camera and/or the like (not shown)) which may be provided as a part of touchless sensing system 12. For example, suitable optical sensor could be used to detect the user's head pose, eye gaze, and handedness (i.e. left or right hand). In some embodiments, capacitive sensors 30 may be used to detect the user's location and/or angle of approach of a portion of the hand of the user (e.g. with a machine learning algorithm). In some embodiments, the line-of-sight sensor includes a height or altitude sensor (e.g. a laser-based sensor) configured to determine the height of retrofit interface apparatus 10 (or a particular portion thereof). In such embodiments, the user's line-of-sight may be estimated based on an average human height together with the height of retrofit interface apparatus 10. This height information could be used in conjunction with other detected values described above to estimate the user's line-of-sight.

Referring back to FIG. 1, retrofit interface apparatus 10 (e.g. controller 20) may be connected to communicate directly with control system 51 of target device 50 using control signals 16. In this manner, retrofit interface apparatus 10 may replace or complement (i.e. provide an alternative to or add to) the input functionality of the existing touch-based input 50A of target device 50 and its input signals 19. In some embodiments, retrofit interface apparatus 10 includes wiring with one or more suitable communication protocols (e.g. USB, SPI, I2C, CAN, RS-232, Serial, etc.). The wiring of retrofit interface apparatus 10 can be provided in an easy-to-plug package for easy integration with target device 50, where target device 50 includes wiring with one or more corresponding communications protocols. For example, where existing touch-based input 50A of target device 50 is a USB mouse or a similar USB input device, retrofit interface apparatus 10 may plug directly into the USB jack of target device 50 to provide touchless input functionality to target device 50. Connection of retrofit interface apparatus 10 with target device 50 can additionally or alternatively be achieved by coupling to existing electrical nodes (not shown) of target device 50. For example, such electrical nodes may comprise the same nodes as those by which touch-based input 50A is connected to control system 51. In some embodiments, the connection of touch-based input 50A may be disconnected from such electrical nodes, so that retrofit interface apparatus replaces the functionality of touch-based input 50A with touchless input, although this is not necessary.

The design of retrofit interface apparatus 10 can take several scalable forms. Some embodiments of retrofit interface apparatus 10 comprises a modular design that allows the manufacturer, and OEM 3rd party, or the end-user themselves to connect single 'block' units into larger units to cover larger touch-based interfaces. A single unit may be applicable to a target device 50 that is street light signal (which only has a single button, while twelve units combined in a 3×4 grid may be used where the target device 50 comprises an intercom system having a keypad. This modular design would mean that each modular block may comprise a capacitive sensor, a method for visual or tactile feedback, and a TAC, although some such implementations could share some such components between modular blocks.

FIG. 1A is a schematic depiction of retrofit interface apparatus 10A according to another example embodiment of the invention. Like retrofit interface apparatus 10 described above, retrofit interface apparatus 10A retrofits to a target device 50 (which comprises a touch-based input 50A) to provide touchless input to target device 50. Instead of (or, optionally, in addition to) interfacing with target device 50 using control signals 16 (as was the case with retrofit interface apparatus 10—see FIG. 1), retrofit interface apparatus 10A includes one or more actuators 37 locatable and moveable to interact physically with touch-based input 50A of target device 50. Retrofit interface apparatus 10A may also optionally communicate with display 22 of target device using display signals 18. Actuators 37 may be referred to in the singular or in the plural herein, it being understood that retrofit interface apparatus 10A may comprise one or more actuators 37. Actuators 37 may be connected to controller 20 of retrofit interface apparatus 10A to receive an actuator control signals 39 from controller 20. Actuator control signals 39 may be used by controller 20 to control the movement of actuators 37. Retrofit interface apparatus 10A may also comprise suitable actuator drive circuitry (not expressly shown), such as power sources, amplifiers and/or the like, which may be used to drive actuator 37 in response to actuator control signals 39. Actuators 37 may, in response to actuator control signals 39, move to interact physically with the touch-based input 50A of target device 50 and may thereby provide touchless (from the perspective of a user) input to target system 50.

Actuators 37 of retrofit interface apparatus 10A may push, pull, slide, rotate or otherwise physically interact with and/or exert force on touch-based input 50A of target device 50. Touch-based input 50A of target device 50 may comprise many forms and, consequently, actuators 37 may comprise many different types of actuators 37 desirable for interacting with particular touch-based inputs 50A. By way of non-limiting example, actuators 37 may be used to push a keypad button; turn, pull or push a dial or knob; turn a door handle; slide a latch or slider input, touch a touch sensor and/or the like. Actuators 37 may be suitably located, relative to target device 50, so as to interact in a suitable manner with touch-based input 50A of target device 50.

In some embodiments, touch-based input 50A of target device 50 comprises a touchscreen interface and actuators 37 may be used to touch the touchscreen interface (e.g. with a conductive stylus, tip and/or the like). In some such embodiments, actuators 37 may be located, moved into position and/or sized to interact with a portion of the touchscreen where input may be provided (e.g. a portion where a touch button, keypad, or keyboard typically appears), so that the visibility of other portions of the touchscreen interface are not blocked by actuators 37.

In some embodiments, actuators 37 may comprise electromechanical actuators powered by electrical power, such as motors, solenoids, linear actuators, hydraulic actuators, piezoelectric actuators and/or the like. Some embodiments of retrofit interface apparatus 10A may comprise an assortment of actuators 37 to retrofit to a target device 50 comprising an assortment of touch-based inputs 50A. One exemplary embodiment of actuators 37 comprises a discrete matrix array of solenoids or motors—arranged in a grid formation and located or locatable to push corresponding buttons of touch-based input 50A—e.g. keypad buttons, keyboard buttons, touchscreen virtual buttons and/or the like. In some such embodiments, there may be a one to one correspondence between actuators 37 and individual inputs (e.g. buttons, virtual buttons, touch screen locations and/or the like) of touch-based inputs 50A, although this is not necessary. In some embodiments, one actuator 37 may be located, moved into position, sized and/or otherwise used to interact with more than one individual input (e.g. buttons, virtual buttons, touch screen locations and/or the like) of touch-based inputs 50A.

In some embodiments, actuators 37 are supported for movement relative to touch-based input 50A. For example, actuators 37 could be supported on a moveable gantry or a framework with a moveable head, so that actuators 37 can be moved into a vicinity of touch-based input 50A (or a portion thereof) to facilitate interaction with touch-based input 50A. For example, actuators 37 may comprise a grid arrangement of solenoids supported on a 'gantry', a framework with a moveable head or the like, so that the grid of solenoids could be positioned adjacent to and push a keypad button. Some embodiments, may use a suitable system involving the use of magnetic and/or electrical fields to position one or more suitable actuators 37 for interaction with individual inputs of touch-based input 50A.

Retrofit interface apparatus 10A may include solenoid actuators 37. Solenoid actuators 37 comprise one or more solenoids which utilize changes in electrical current to generate a magnetic field inside their respective coils which in turn creates linear motion. When actuating, a metallic rod located inside the solenoid may be either pushed outside the coil or pulled into the coil. Retrofit interface apparatus 10A may comprise a matrix of discrete (e.g. independently controllable) solenoid actuators 37 in some embodiments. By way of non-limiting example, a grid arrangement of solenoid actuators 37 placed adjacent to the buttons (or virtual buttons) of touch-based input 50A of target device 50 would be able to press a given button. Solenoid actuators 37 may have a compact mechanical design when compared to motor-based actuators 37.

Retrofit interface apparatus 10A may additionally or alternatively comprise motor-based actuators 37. For example, motor-based actuators 37 may comprise one or more servo, DC, or stepper motors to push, pull, linearly actuate, or rotate touch-based input 50A of target device 50. Motor-based actuators 37 may comprise, or be equipped with, suitable mechanisms for manipulating the direction, power, speed and/or other characteristics of the force created by their respective motors. Motor-based actuators 37 comprising or equipped with such mechanisms could be utilized to, for example, create a linear force to push a button on touch-based input 50A or rotate a set of gears (e.g. a gear train) to generate sufficient power and/or range to turn a door handle of touch-based input 50A. Motor-based actuators 37 may be more power efficient when compared to solenoid-based actuators 37.

Figure 9:
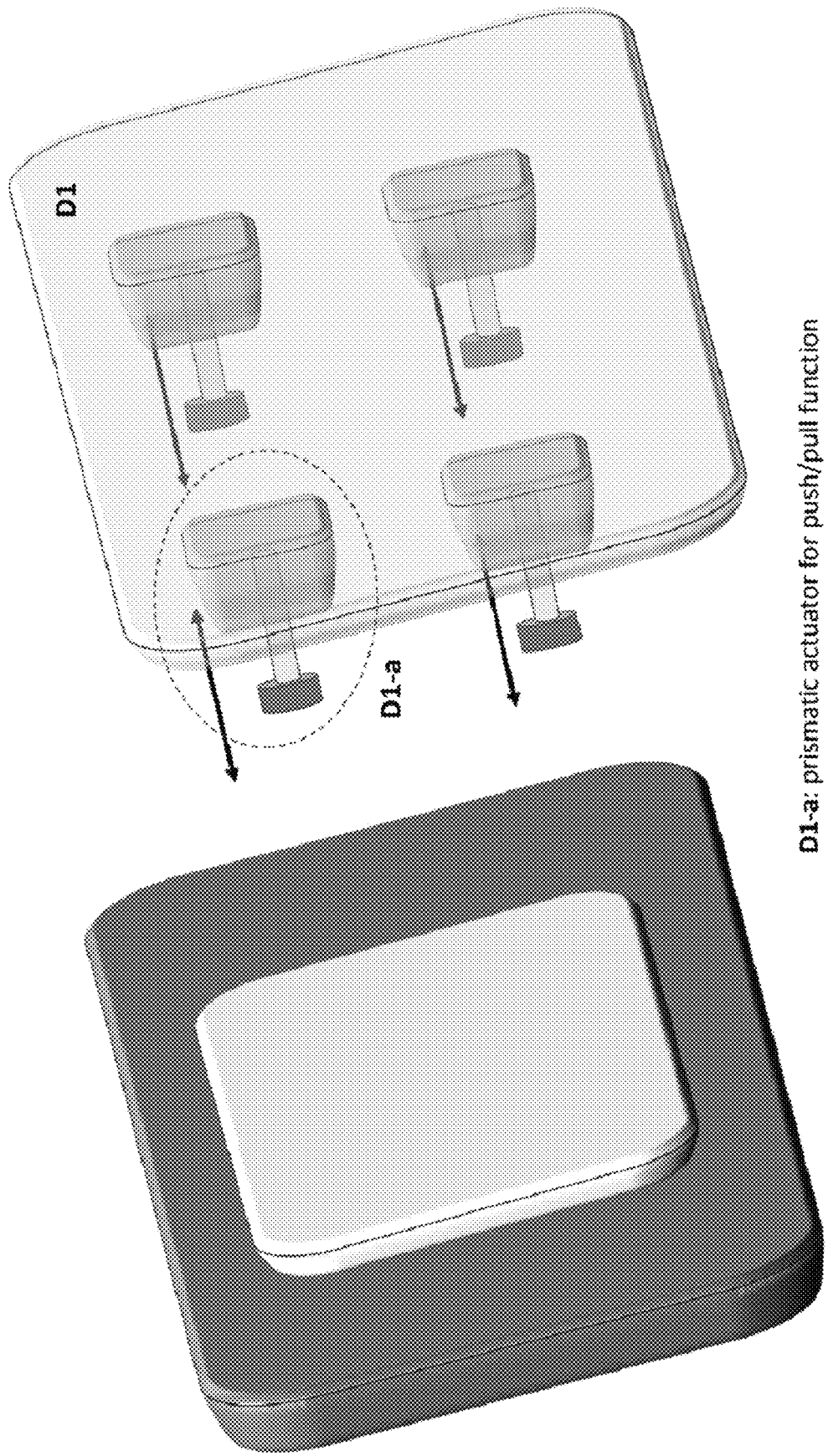
FIG. 9 is a schematic exploded view of the FIG. 1A retrofit interface apparatus comprising a plurality of linear actuators according to a particular embodiment.

As alluded to above, actuators 37 are not limited to solenoids and/or motors. Other suitable actuators 37 may include, by way of non-limiting example, linear actuators, hydraulic/pneumatic actuators, piezoelectric actuators, thermal actuators, spring-based actuators, magnetic actuators, electrostatic actuators and/or the like. FIG. 9 is a schematic exploded view of the FIG. 1A retrofit interface apparatus 10A comprising a plurality of linear actuators 37 according to a particular embodiment.

In other respects retrofit interface apparatus 10A may be similar to retrofit interface apparatus 10 described herein. Unless the context specifically dictates otherwise, reference to features of retrofit interface apparatus 10 should be understood to be applicable to retrofit interface apparatus 10A.

Figure 1B:
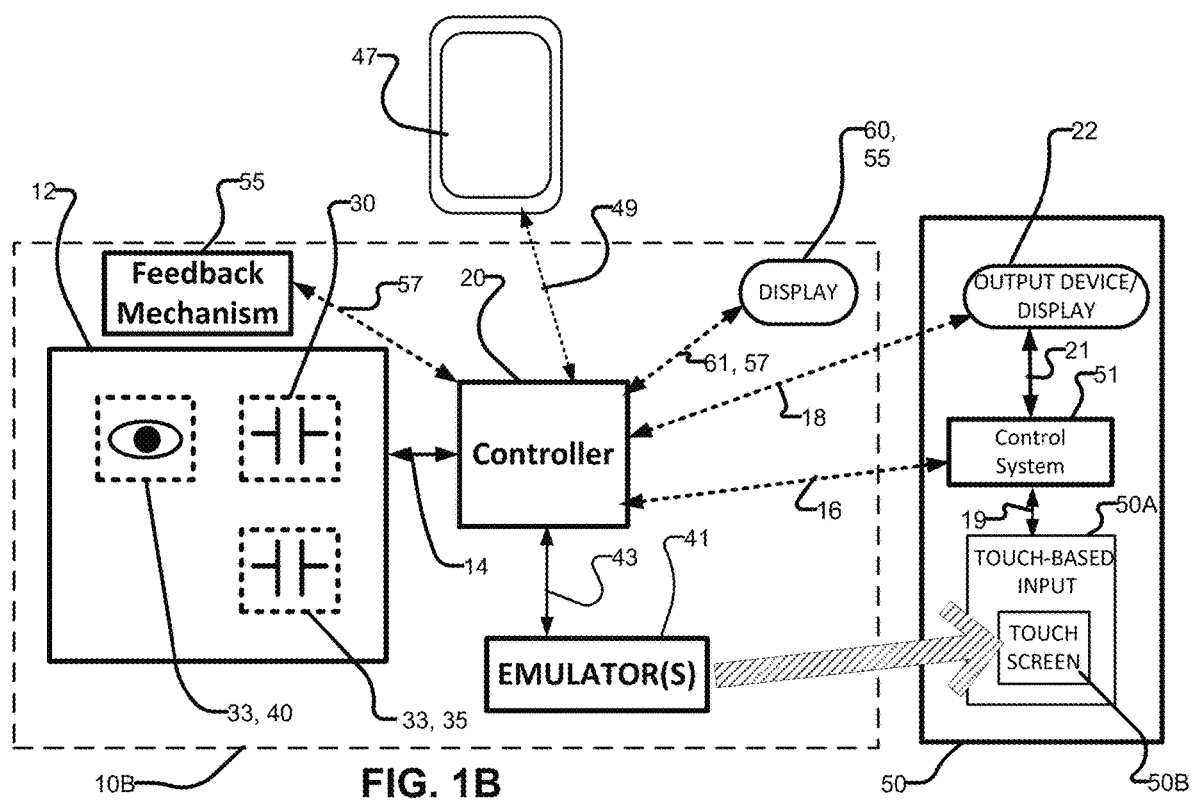
FIG. 1B illustrates a retrofit interface apparatus according to another example embodiment.

FIG. 1B schematically illustrates a retrofit interface apparatus 10B according to another example embodiment. Like retrofit interface apparatus 10, 10A described herein, retrofit interface apparatus 10B retrofits to a target device 50 (which comprises a touch-based input 50A) to provide touchless input to target device 50. In the case of retrofit interface apparatus 10B of the FIG. 1B embodiment, touch-based input 50A of target device 50 comprises a touchscreen input 50B. Instead of (or, optionally, in addition to) interfacing with target device using control signals 16 (as was the case with retrofit interface apparatus 10—see FIG. 1) or using moving actuators 37 (as was the case with retrofit apparatus 10A—see FIG. 1A), retrofit apparatus 10B comprises one or more touch emulators 41, which are controllable to electrically interact with touchscreen 50B of target device 50 by emulating the touch of a user's body. Retrofit interface apparatus 10B may also optionally communicate with display 22 of target device using display signals 18. In some embodiments, retrofit interface apparatus 10B may optionally comprise actuators (like actuators 37 of retrofit interface apparatus 10A) for interacting with touch-based inputs 50A.

Touch emulators 41 may be referred to in the singular or in the plural herein, it being understood that retrofit interface apparatus 10B may comprise one or more touch emulators 41. Touch emulators 41 may be connected to controller 20 of retrofit interface apparatus 10B to receive emulator control signals 43 from controller 20. Emulator control signals 43 may be used by controller 20 to control electrical characteristics of touch emulators 41. Touch emulators 41 may, in response to emulator signals 43, interact electrically with the touch-based input 50A (touchscreen 50B) of target device 50 to emulate human touches and may thereby provide touchless (from the perspective of a user) input to target system 50.

Figure 4A:
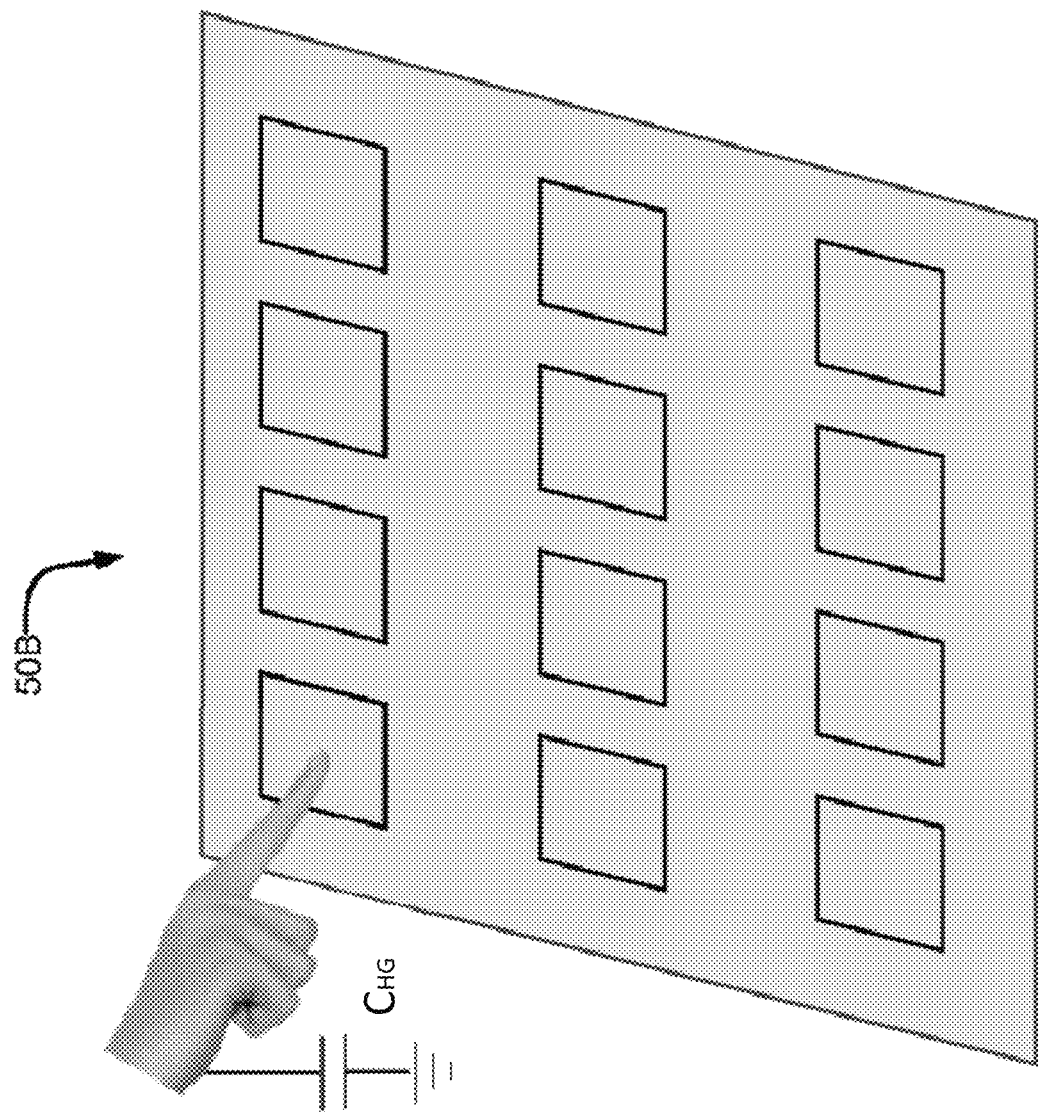
FIG. 4A schematically illustrates a touchscreen of a target device.

FIG. 4A schematically depicts a typical capacitive touchscreen 50B of a typical target device 50. Touchscreen 50B is typically coated with a layer of transparent conductive material (e.g. indium tin oxide (ITO)). When touchscreen 50B is contacted by a conductive element (such as the finger of a user), the local electrical characteristics (specifically the local charge, local capacitance and/or local electrical field) changes at the location of the touch and this touch event is observed by touchscreen 50B and/or by control system 51 of target device 50 (see FIG. 1B).

Figure 4B:
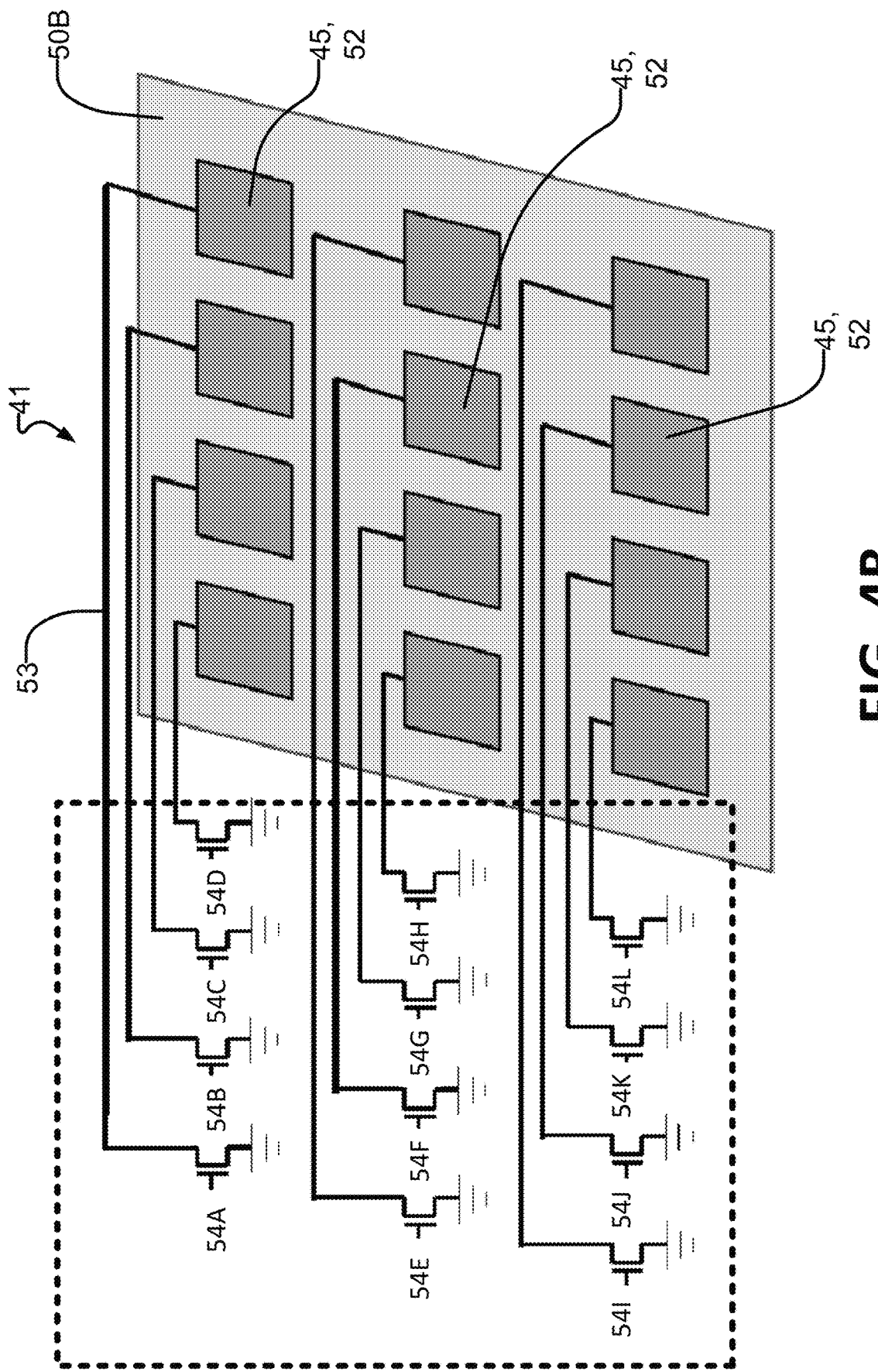
FIG. 4B schematically illustrates a touch emulator which may be used with the FIG. 1B retrofit interface apparatus according to a particular example embodiment.

FIG. 4B schematically illustrates a touch emulator 41 according to a particular example embodiment. Touch emulator 41 of the FIG. 4B embodiment comprises one or more elements (e.g. cells) of transparent conductive film 45 which may in turn comprise Indium Tin Oxide (ITO), conductive carbon nanotubes, graphene, polymeric materials, thin metal (e.g. silver) nanowires, and/or the like. Transparent conductive film 45 may be located adjacent (e.g. within a suitable interaction proximity) to one or more regions of touchscreen 50B. For example, transparent conductive film 45 may directly overlay (and may be in contact with) touchscreen 50B. Transparent conductive film 45 may be controllably and selectively connectable to ground (i.e. the ground of touchscreen 50B or a ground sufficiently close to the voltage potential of the ground of touchscreen 50B) to change the local charge, local capacitance and/or local electrical field and thereby emulate a "touch" at that region of touchscreen 50B. For example, in the exemplary illustrated embodiment of FIG. 4B, transparent conductive film 45 is divided into a plurality of cells 52 and each cell 52 may be in direct physical contact (e.g. via a conductive adhesive or an applied pressure) with a corresponding region of touchscreen 50B. It will be appreciated that the number of cells 52 and number of corresponding regions of touchscreen 50B shown in FIG. 4B is for illustration only and that the number and/or layout of cells 52 may differ in different embodiments.

Each cell 52 may be controllably and selectively connectable to ground through an electrical conductor 53 (e.g. a wire, PCB trace and/or the like) and a suitable switch (shown as switches 54A-54L (collectively, switches 54) in FIG. 4B). Each cell 52 of transparent conductive film 45 may be electrically isolated from the other cells 52. Each electrical conductor 53 may be electrically isolated from the other electrical conductors 53. Cells 52 may be laid out in a suitable grid arrangement or any other suitable arrangement (which may depend on the locations of virtual buttons on touchscreen 50B). The number, size, and/or arrangement of cells 52 may determine the touch emulation resolution of emulators 41 and retrofit interface apparatus 10B. In some embodiments, electrical conductors 53 are transparent (e.g. made of one or more transparent conductive materials) or made of thin strands of conductive material (e.g. metal nanowires) that appear transparent to the user. Electrical conductors 53 may be electrically connected to cells 52 with transparent conductive adhesive or solder. Electrical conductors 53 may be arranged to minimize the amount of wiring located between touchscreen 50B and the user.

Switches 54 (e.g. MOSFET transistors, switching relays, and/or the like) are electrically connected between each cell 52 and electrical ground. Controller 20 of retrofit interface apparatus 10B may control switches 54 using emulator signals 43 (see FIG. 1B). Specifically, controller 20 may be configured to switch a particular electrical switch 54 between an ON configuration, where switch 54 is conducting and which connects its corresponding cell 52 to ground and an OFF configuration, where switch 54 is non-conducting. When a switch 54 is in the ON configuration and conducting, touchscreen 50B of target device 50 may interpret this as a touch event at the location of a corresponding cell 52. Upon touchless sensing system 12 detecting a touchless input (e.g. a finger tapping gesture) from a user, controller 20 may use emulator signals 43 to switch one or more electrical switches 54 to an ON position. Controller 20 may be configured to control electrical switches 54 in real-time (i.e. with very little or no time delay between a touchless tap detected by touchless sensing system 12 and a touch-emulated tap).

In some embodiments, retrofit interface apparatus 10B is configured to establish a spatial correspondence between touchless sensing system 12 and cells 52 of touch emulator 41. Advantageously, the spatial correspondence may allow a user to actuate a cell 52 of touch emulator 41 by entering a touchless input (e.g. a finger tapping gesture) directly adjacent to cell 52 (e.g. a touchless tap may be detected by touchless sensing system 12 and controller 20 may use emulator signals 43 to turn ON a switch 54 corresponding to a cell 52 that is adjacent to the location of the user's touchless tap). Preferably, electrical switches 54 have low stray/parasitic capacitance to establish a strong connection to ground when switched ON. Controller 20 may be located adjacent to or behind touchscreen 50B. In some embodiments, controller 20 may be integrated with touchless sensing system 12.

Retrofit interface apparatus 10B (via touchless sensing system 12) may be configured to detect a wide variety of touchless inputs and may actuate touchscreen 50B in a variety of ways. For example, a touchless input gesture detected by touchless sensing system 12 may be transient (for example, in the case of the tap or double-tap gesture) and retrofit interface apparatus 10B may be configured to temporarily ground a cell 52 to simulate a corresponding gesture on touchscreen 50B. As another example, a touchless input detected by touchless sensing system 12 may be held for a period of time and retrofit interface apparatus 10B may be configured to ground a cell 52 for a corresponding period of time to simulate a longer "touch-hold" on touchscreen 50B. As another example, the touchless input detected by touchless sensing system 12 may comprise hovers, drags, swipes, pinches or the like, and retrofit interface apparatus 10B may be configured to ground one or more of cells 52 in at the same time, over a temporal period, or sequentially to emulate such movements across the electrically conductive surface of touchscreen 50B.

In some embodiments, transparent conductive film 45 of touch emulators 41 and capacitive sensors 30 of touchless sensing system 12 are provided on the same printed circuit board, although this is not necessary. In some such embodiments, transparent conductive film 45 and capacitive sensors 30 may be electrically isolated from one another. For example, a PCB (e.g. a transparent PCB) may comprise transmit and receive electrodes of capacitive sensors 30 located on two of its layers that are distal from touchscreen 50B of target device 50 and cells 52 of transparent conductive film 45 may be located one of its layers proximate (e.g. most proximate) to touchscreen 50B for contact with touchscreen 50.

In some embodiments, retrofit interface apparatus 10B and/or touch emulators 41 may include a coating or other layered material to provide water resistance or waterproofing. In some embodiments, retrofit interface apparatus 10B and/or emulators 41 can be built to withstand varying ranges of temperature and humidity (i.e. to match the touchscreen 50B of target device 50 that is being retrofitted).

Advantageously, retrofit interface apparatus 10B can be easily integrated with an existing touchscreen 50B (i.e. a common type of touch-based interface in public spaces) without the need to connect retrofit interface apparatus 10B directly to control system 51 of target device 50 (although such connection is optional). Retrofit interface apparatus 10B can be configured to allow a user to touchlessly interact with an existing touchscreen 50B of target device 50.

In other respects retrofit interface apparatus 10B may be similar to retrofit interface apparatus 10 described herein. Unless the context specifically dictates otherwise, reference to features of retrofit interface apparatus 10 should be understood to be applicable to retrofit interface apparatus 10B.

Figure 1C:
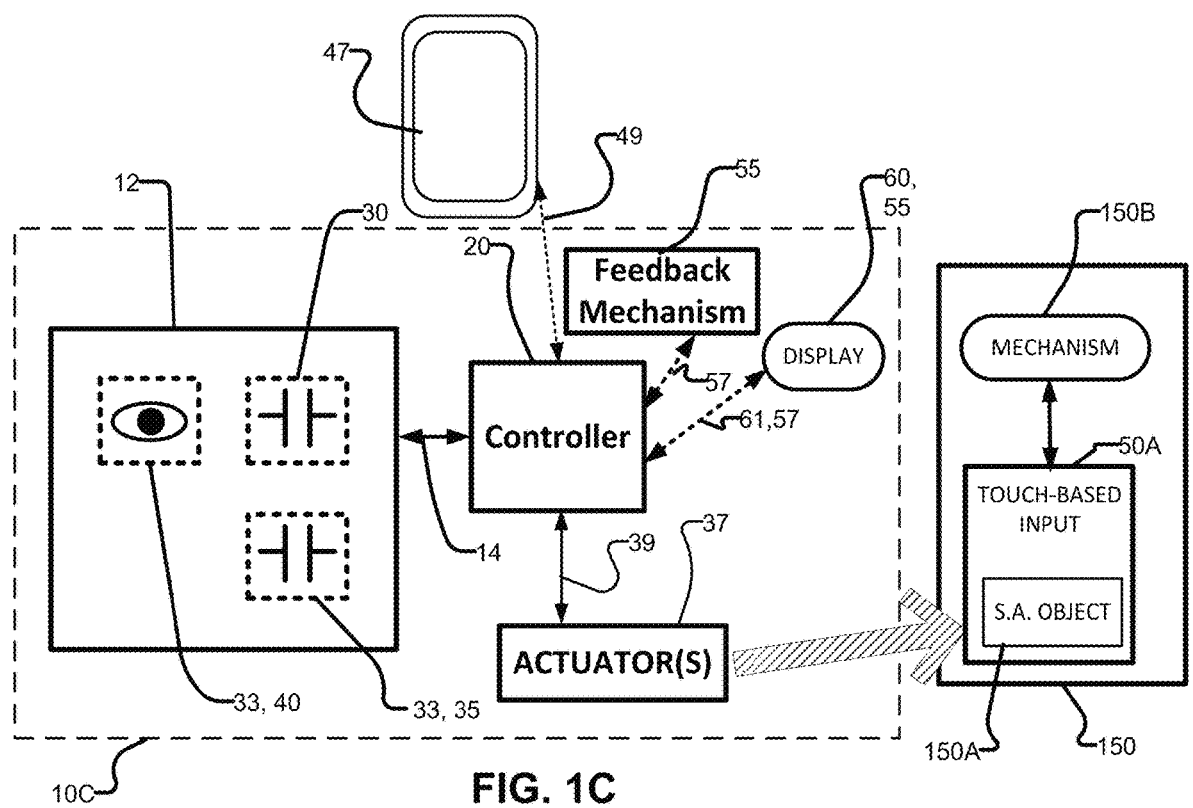
FIG. 1C illustrates a retrofit interface apparatus according to another example embodiment.

FIG. 1C schematically depicts an example embodiment of an additional aspect of the invention which relates to retrofitting a retrofit interface apparatus 10C to a target mechanical apparatus 150 which does not include its own controller, but which includes a touch-based input 50A (which may be described as a self-actuating object 150A) where (in a touch based context) user interaction with self-actuating object effects operation of a corresponding mechanism 150B of target mechanical apparatus 150. Non-limiting examples, of target mechanical apparatus 150 include: door handles/knobs (where the self-actuating object 150A is a mechanism of the handle/knob and the target mechanism 150B is the tongue/bolt), mechanical lock mechanisms (where the self-actuating object 150A is a lock handle and the target mechanism 150B is the lock shaft), a light switch (where the self-actuating object 150A is a lever of the light switch and the target mechanism 150B is the switch contact) and/or the like. Retrofit interface apparatus 10C may comprise actuators 37 that are specific for interacting with their respective self-actuating objects 150A. In other respects, retrofit interface apparatus 10C may be similar to retrofit apparatus 10A (FIG. 1A) described herein and, unless the context dictates otherwise, features of retrofit interface apparatus 10C should be considered to be similar to those of retrofit interface apparatus 10A described herein.

In some embodiments, retrofit interface apparatus 10C and target mechanical apparatus 150 may be manufactured or otherwise provided as a single device, where self-actuating objects 150A are manufactured to operate like normal touch-based devices but include retrofit interface apparatus 10C to allow self-actuating object 150A to be touchlessly actuated. In some such embodiments, retrofit interface apparatus 10C may comprise a display 60 for user interaction or instruction. For example, target mechanical apparatus 150 may comprise a light switch that is pressed or flicked with a hover-tap or swipe without any physical touch of the light switch occurring. As another example, target mechanical apparatus may comprise a door handle that is rotatable by hovering a FOB over a suitable virtual button or the like.

Any of the retrofit interface apparatus described herein (e.g. retrofit interface apparatus 10, 10A, 10B, 10C) may facilitate interaction with the user's smartphone or handheld computing device 47 (e.g. communication between controller 20 and handheld device 47 via mobile device signals 49). By way of non-limiting example, retrofit interface apparatus 10 may include a QR code, an NFC/RFID tag, a WIFI/Bluetooth connection and/or the like to allow a user to utilize the keyboard/keypad input of their handheld computing device 47 to wirelessly provide input (e.g. button selections, alphanumeric text, sliding gestures and/or the like) to controller 20 via mobile device signals 49, which may in turn provide corresponding inputs to target system 50. This allow a user to utilize their own handheld device 47 to interact with retrofit interface apparatus 10, which in turn interacts with target device 50 in such a manner that the user need only physically contact their own handheld device 47 to communicate (e.g. provide input to) target apparatus 50. In some embodiments, handheld device 47 may be used by a user in addition to or in the alternative to touchless sensing system 12 to provide input signals 49 to controller 20.

Retrofit interface apparatus 10 may be configured (e.g. by suitable programming of controller 20) with a software application (e.g. a smartphone app) which facilitates quick connection to retrofit interface apparatus 10 and also for quick automatic disconnection from retrofit interface apparatus 10. Retrofit interface apparatus 10 may be configured (e.g. by suitable programming of controller 20) with a software application which facilitates quick connection to, and/or disconnection from, handheld device 47.

In some embodiments, connection between handheld device 47 and retrofit interface apparatus 10 is limited to a particular user handheld device 47 or to one particular handheld device at a time, to prevent target device 50 from receiving user input from more than one handheld device 47 or from receiving input from more than one handheld device 47 at a time. Such embodiments may be suitable for secure applications (e.g. for entering a pin code at a point of sale terminal and/or the like) and/or for individual-use applications (e.g. parking meters and/or the like). One example implementation of such an embodiment comprises using a timer configured to disconnect each handheld user device 47 from retrofit interface apparatus 10 after a threshold time period (e.g. after a threshold time period of inactivity) and/or using an event detection algorithm to disconnect each handheld user device 47 from retrofit interface apparatus 10 after detection or completion of an event to allow a new user to connect. Another additional or alternative example implementation of such an embodiment involves configuring retrofit interface apparatus 10 to require that the user device 47 keep the QR code or NFC tag within view of the camera or NFC sensor of handheld device 47 while in use to communicate with retrofit interface apparatus 10. Another additional or alternative implementation of such an embodiment involves providing retrofit interface apparatus 10 with suitable communication hardware and/or software (e.g. a WIFI and/or Bluetooth antenna) that may be configured to estimate the proximity of handheld device 47 and the connection between handheld device 47 and retrofit interface apparatus 10 could expire as soon as the proximity of handheld device 47 reaches a threshold distance away from retrofit interface apparatus 10.

Retrofit interface apparatus 10 may include a variety of methods to receive communication of input selections from handheld device 47. Example methods include, without limitation, coded acoustic signaling, LED light signaling, utilizing a camera system to view alphanumeric text or a QR code displayed on the smartphone screen and/or the like (e.g. a piece of paper), NFC or RFID.

Any of the retrofit interface apparatus described herein (e.g. retrofit interface apparatus 10, 10A, 10B, 10C) may comprise one or more feedback mechanisms 55 for providing feedback to users interacting with target device 50 via retrofit interface apparatus 10. Such feedback mechanisms 55 may be controlled by controller 20 using suitable feedback control signals 57. As discussed elsewhere herein, display 60 of retrofit interface apparatus 10 may comprise part of feedback mechanism 55. Retrofit interface apparatus 10 according to particular embodiments may comprise one or more of the following feedback mechanisms 55.

Retrofit interface apparatus 10 may include a feedback mechanism 55 comprising an ultrasonic and/or acoustic wave transmission (collectively referred to herein as sonic-wave transmission (SWT)) feedback mechanism. SWT feedback may be used to create touchless haptic feedback by simulating a button-clicking sensation that can be felt by human skin (e.g. the feeling typically sensed when fingers strike keys on the surface of a conventional keyboard, the left/right buttons of a touchpad mouse or some other suitable sensation) to thereby indicate to a user that an input has been made (e.g. a selection has been made, a button has been pushed and/or the like).

A typical, off-the-shelf, PCB comprising capacitive sensors 30 will not support SWT. A sonic wave transducer located behind such a PCB will not be able to be felt by a finger on the other side of the PCB. Retrofit interface apparatus 10 (and/or other retrofit interface apparatus 10A, 10B, 10C described herein) may include design configurations that allow for capacitive sensors and SWT to coexist in a single form-factor. Touchless haptic feedback may be achieved by arranging touchless sensing system 12 (e.g. capacitive sensor(s) 30) and sonic transducers 55A (e.g. on a PCB or otherwise) to allow for acoustic energy from the SWT transducers 55A to reach the sensing zone of touchless sensing system 12, while not interfering with (or not unduly interfering with) the sensing operation of the sensors of touchless sensing system 12.

For example, retrofit interface apparatus 10 and/or retrofit interface apparatus 10A may include a 'perimeter' arrangement whereby a circular, oval, or rectangular assortment of SWT transducers are placed around or partially around the perimeter of the capacitive sensor PCB—likely aimed towards the center of the sensing zone on the user-facing side of the capacitive sensor PCB. This arrangement of SWT transducers around or partially around the perimeter of the capacitive sensor PCB provides an unfettered path for sonic waves to strike a human finger to feel button-click sensations. SWT transducers may be configured to direct sonic energy to a user's finger position to simulate the feeling of a button-click and/or the like on the user's finger. In some embodiments, the finger position detected by touchless sensing system 12 can be processed by a suitably configured controller (e.g. controller 20) to control the sonic transducers (via feedback control signals 57) to direct sonic waves towards the detected location of the finger.

Figure 7A:
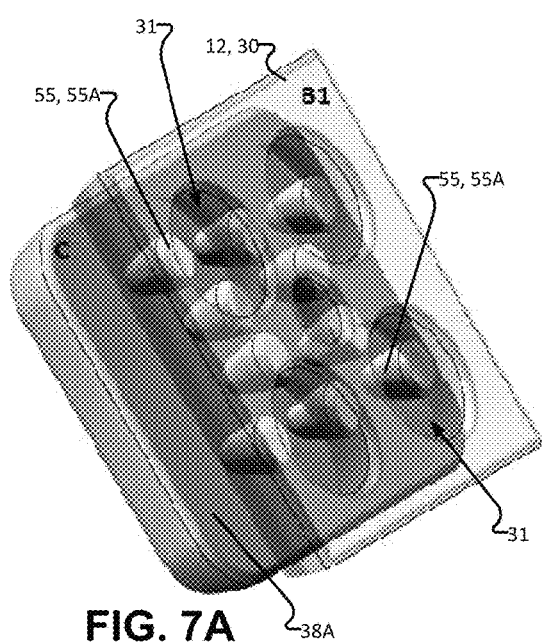
FIGS. 7A and 7B schematically illustrate sonic wave transmission feedback mechanisms and touchless sensing mechanisms which may be used with any of the retrofit interface apparatus described herein according to particular embodiments.
Figure 7B:
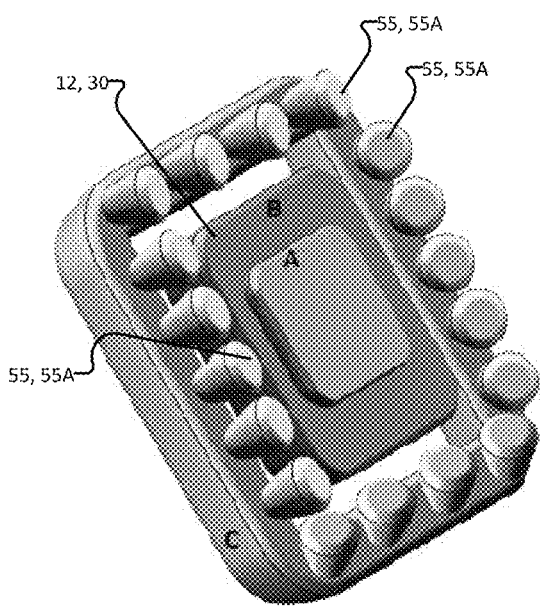

FIGS. 7A and 7B schematically illustrate sonic wave transmission feedback mechanisms 55 comprising SWT transducers 55A and touchless sensing mechanisms 12 comprising capacitive sensor(s) 30 which may be used with any of the retrofit interface apparatus 10, 10A, 10B, 10C described herein according to particular embodiments. In the illustrated embodiments of FIGS. 7A, 7B, SWT feedback mechanism 55 comprises a layout of sonic transducers 55A, which may be positioned on a surface (that may be shaped to be concave or flat). In the illustrated embodiment of FIG. 7A, surface 38A which supports sonic transducers 55A is generally flat, and sonic transducers 55A are supported on surface 38A, are located behind (i.e. further from the user) than the touchless sensing system 12 (e.g. behind one or more capacitive sensor(s) 30). In the FIG. 7A embodiment, capacitive sensor(s) 30 or some of their electrodes (or sensing system 12 generally) are perforated with apertures 31 through which SWT transducers 55A may direct sonic waves into a sensing zone of capacitive sensors 30 (or sensing system 12 generally). In some embodiments, as few as a single large aperture 31 can be provided. In some embodiments, a matrix comprising a plurality of smaller apertures 31 may be provided. In the illustrated embodiment of FIG. 7B, surface 38B which supports sonic transducers 55A has a concave portion and sonic transducers 55A are located around a perimeter of touchless sensing system 12 (e.g. around one or more capacitive sensor(s) 30) and are directed to generate sonic waves on a user-facing side of touchless sensing system (e.g. in the sensing zone of capacitive sensor(s) 30 and/or touchless sensing system 12 generally). In some embodiments, the configuration of FIG. 7B could be reversed. That is, capacitive sensors 30 (or one set of their electrodes) could be arranged in a ring shape and sonic transducers 55A could be arranged in a central aperture of the ring of capacitive sensors 30. In some embodiments, aspects of the feedback systems 55 shown in FIGS. 7A and 7B can be combined. For example, surface 38A which supports sonic transducers in the FIG. 7a embodiment, can be made to have a concave shape. In some embodiments, sonic transducers 55A may be fabricated (at least primarily) from non-conductive materials.

Retrofit interface apparatus 10 may include a feedback mechanism 55 comprising a visual feedback apparatus. In some embodiments, visual feedback apparatus may be implemented via display 22 of target device 50 using display signals 18 (and/or indirectly via control signals 16 and display signals 21). In some embodiments, visual feedback apparatus of feedback mechanism 55 of retrofit interface apparatus 10 may comprise its own display 60 controlled by display signals 61. In some embodiments, target device 50 does not have a display 22 and feedback mechanism 55 of retrofit interface apparatus 10 comprise the only display or visual indicator(s). In some embodiments, feedback mechanism 55 provides visual feedback via a display screen, such as an LCD screen, an e-ink screen, or any other suitable display screen. Display 60 may be incorporated into an external panel (e.g. a panel located adjacent to a PCB which houses touchless sensing system 12). Retrofit apparatus 10 may use display 60 and/or display 22 to provide an interactive touchscreen-like user experience with touchless sensing system 12. For brevity, the remainder of this description of visual feedback refers to display 60 that is part of retrofit interface apparatus 10 controlled by display signals 61 without loss of generality that such visual feedback may additionally or alternatively be provided by display 22 that is part of target device 50 controlled by display signals 18 or indirectly by control signals 16 and display signals 21.

Figure 8A:
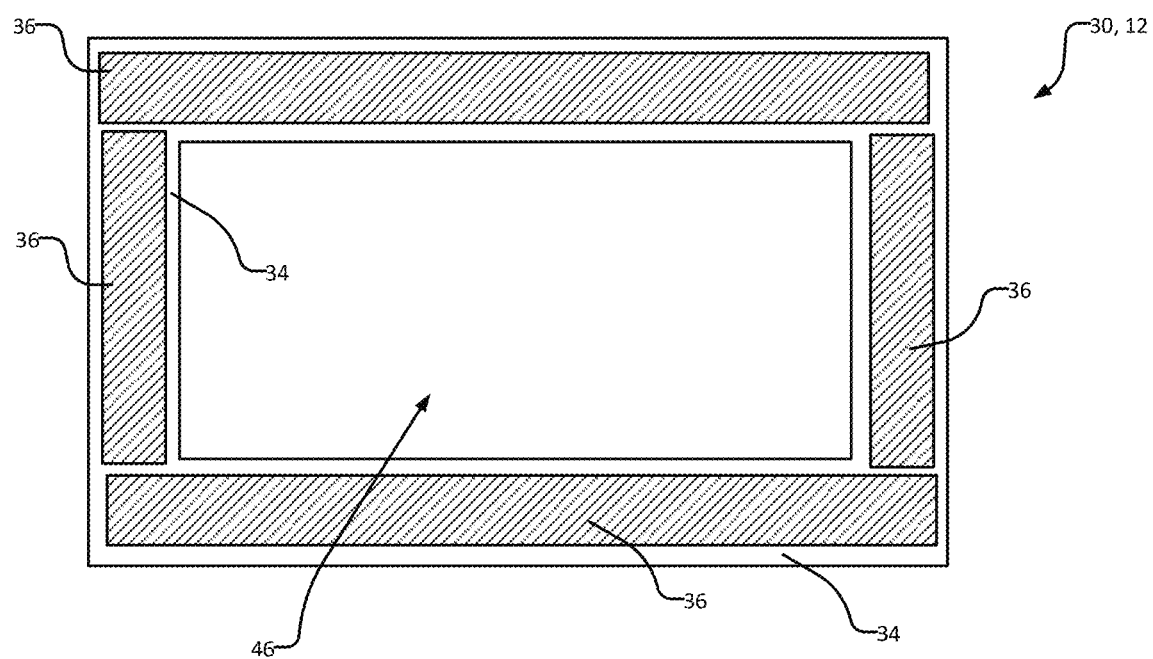
FIG. 8A shows a schematic depiction of capacitive sensors comprising a one or more receive electrodes and one or more transmit electrodes arranged in a ring around an aperture according to a particular embodiment.

FIG. 8 schematically depicts an exploded view of a touchless sensing system 12 which comprises one or capacitive sensors 30 and, optionally, one or more optical sensors 40 and/or additional sensors 33 (not expressly shown in FIG. 8) arranged in a "ring" shape around a display 60 which may be used feedback mechanism 55 of any of the retrofit interface apparatus 10, 10A, 10B, 10C described herein according to a particular embodiment. For clarity, controller 20 is not shown in FIG. 8, but may be housed together with sensing system 12 and/or display 60. As shown in FIG. 8, capacitive sensors 30 of touchless sensing system 12 may be located adjacent to display 60 and the PCB supporting capacitive sensors 30 may be sized, shaped and/or located such that the receive electrodes 36 of capacitive sensors 30 are arranged outside the confines of (e.g. around a portion of, or completely around, a perimeter of) display 60 to provide a sensing region around and in front of (i.e. on a user-facing side of) display 60. That is, the PCB supporting capacitive sensors 30 may be designed to form a "ring" around or partially around a perimeter of display 60, such that the sensing zone of the capacitive sensors 30 is located on a user-facing side of display 60. In some embodiments, the PCB supporting capacitive sensors 30 may be displaced toward the user slightly (relative to display 60) to mitigate interference which may be caused by display 60 to the electric fields of capacitors 30. The center 46 of the ring of capacitive sensors 30 may correspond generally in size and shape to the active portion of display 60—i.e. the portion of display 60 that actually displays content. FIG. 8A shows a schematic depiction of capacitive sensors 30 comprising a one or more receive electrodes 36 and one or more transmit electrodes 34 arranged in a ring around an aperture 46 according to a particular embodiment. In some embodiments, capacitive sensors 30 may be arranged around (or partially around) the perimeter of an aperture 46 which may be used for purposes other than display 60. For example, display 22 or some other surface may be viewed through aperture 46.

Figure 8B:
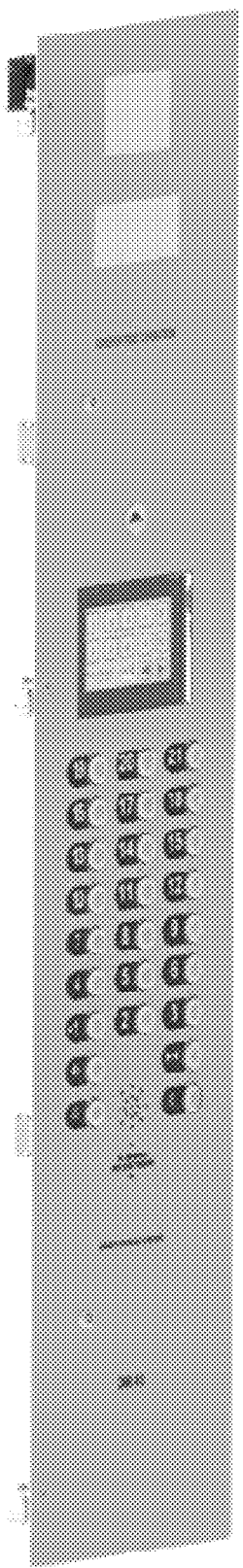
FIG. 8B is a schematic depiction of the FIG. 8 retrofit interface apparatus applied to a target device comprising an elevator panel.

In some embodiments, the center 46 of the ring of capacitive sensors 30 is an empty aperture. In some embodiments, this center 46 of the ring of capacitive sensors 30 may comprise a suitable transparent material (e.g. glass, plexiglass (poly(methyl methacrylate)) and/or the like). In some embodiments, the transparent material in the center 46 of the ring may comprise a transparent conductive material (e.g. Indium-Tin-Oxide (ITO) or any other suitable transparent material). In some such embodiments, the transparent conductive material can form one of the electrodes (e.g. the transmit electrode) of capacitive sensors 30, so that only one of the electrodes (e.g. the receive electrodes) of capacitive sensors 30 are arranged in the ring around display 60. Having an electrode in center region 46 may help provide uniformity in the sensors' electric field and enhance its precision by providing a stronger electric-field in the middle of the PCB. Providing a stronger electric-field in the middle of the PCB can help touchless sensing system 12 better detect the finger rather than the more massive fist/forearm which is located further away—thereby increasing the precision of touchless sensing system 12. In some such embodiments, both the transmit and receive electrodes of the capacitive sensors 30 may fabricated from transparent conductive material, in which case capacitive sensors 30 may be located directly on a user-facing side of display 60—that is, the ring-based layout of capacitive sensors 30 around an aperture 46 shown in FIG. 8 may be changed to a layout that covers "aperture" 46, since both transmit electrodes 34 and receive electrodes 36 are transparent. In the illustrated embodiment of FIG. 8, the ring of capacitive sensors 30 may be partially or completely covered (on the user-facing side) by a suitable sheet 48 of transparent material (e.g. glass, plexiglass (poly(methyl methacrylate)) and/or the like). Transparent sheet or panel 48 can be used to encase capacitive sensors 30 and form a flat non-protruding design that sits flush with a wall or other surface in which apparatus 10 may be mounted. Such a flush design may mitigate tampering with retrofit interface apparatus 10 and, in some cases, may meet industry safety requirements, as is the case when target device 50 is an elevator panel, for example. Such an example of retrofit interface apparatus 10 applied to a target device comprising an elevator panel is shown in FIG. 8B.

Advantageously, such a "ring" design of capacitive sensors 30 may minimize (at least to an acceptable degree) interference which may be caused by display 60 to the electric fields of capacitive sensors 30. Also, the touchless sensing system of FIG. 8 (and shown in FIGS. 3A-3C) advantageously includes the fusion of capacitive sensors 30 and optical sensors 40 which are located away from display 60, include precise transverse (x-y) detection offered by optical sensors 40, precise z-coordinate detection and transverse detection triggering offered by capacitive sensors 30 and useful user feedback offered by the combination of sensing system 12 and display 60.

In some embodiments, controller 20 is configured to generate a display signal 61 that causes display 60 to display an indicia (e.g. a cursor, pointer and/or the like) on display 60. The location of the displayed indicia on display 60 may correspond to, or be based on, an estimated location of a portion of the user's hand (i.e. a location estimated by controller 20 based on input signals 14 received from touchless sensing system 12). The location of the displayed indicia on display screen 60 may additionally or alternatively correspond to, or be based on, a proximity of a portion of the user's hand to display screen 60 (e.g. a proximity estimated by controller 20 based on input signals 14 received from touchless sensing system 12). For example, in some embodiments, controller 20 may cause display 60 to display an indicia indicative of an estimated location of a portion of a user's hand within a plane (e.g. an x-y plane) that is parallel to a plane of display 60, a plane tangential to a surface of display 60 or a plane tangential to some other suitable surface of target device 50 and/or retrofit interface apparatus 10 and then may cause display 60 to display a feature of the indicia (e.g. a size, brightness, color, animation feature(s) and/or the like of the indicia) indicative of proximity (e.g. in a z-direction) of the portion of the user's hand to the plane. In some embodiments, the indicia is displayed on display 60 at all times to inform a user of the user's finger position.

In some embodiments, controller 20 may generate display signals 61 which cause screen 60 to change an appearance of the displayed indicia based on the estimated proximity (e.g. in the z-direction) of the portion of the hand of the user and/or the estimated location of the portion of the hand of the user (e.g. relative to a plane of display 60, a plane tangential to a surface of display 60 or a plane tangential to some other suitable surface of target device 50 and/or retrofit interface apparatus 10). The change of the appearance of the displayed indicia may include at least one of: a change of color of the displayed indicia, size of the displayed indicia, brightness (intensity) of the displayed indicia, changing shape of the displayed indicia, changing a color gradient of the displayed indicia, animation features of the displayed indicia, adding other indicia to the displayed indicia and/or the like. For example, the displayed indicia may be a "ring cursor" and the size of the ring cursor may decrease (i.e. the diameter of the ring cursor may decrease) as the user's hand approaches a threshold distance away from display 60.

In some embodiments, display 60 is configured (by display signals 61 from controller 20) to display one or more virtual inputs (e.g. virtual buttons). In these embodiments, display signals 61 may cause display 60 to change an appearance of the virtual inputs based on the estimated location of a portion of the user's hand and/or an estimated proximity of a portion of the user's hand.

In some embodiments, controller 20 is configured, based on input signals 14 from sensing system 12, to detect a circular motion made with a portion of the user's hand. In some such embodiments, controller 20 may be configured to generate display signals 61 that causes display 60 to provide some visual feedback (e.g. to change an appearance of the one or more displayed virtual inputs) based on the detected circular motion.

In some embodiments, controller 20 is configured, based on input signals 14, to detect that a portion of the hand of the user lacks motion (to within a threshold) for a threshold period of time. In these embodiments, controller 20 may be configured to generate display signals 61 that causes display 60 to provide some visual feedback (e.g. to change an appearance of the one or more displayed virtual inputs) based on the detected lack of motion.

In some embodiments, controller 20 is configured to generate display signals 61 which in turn cause display 60 to vary a size of the displayed indicia in a manner correlated to the proximity of a portion of the user's hand to display 60. In some such embodiments, controller 20 may be configured to change control signal 16 to thereby effect operation of target device 50 (e.g. to make a selection) when the size of the displayed indicia is the same (to within a suitable threshold) as a size of one of a plurality of displayed virtual inputs and when the location of the portion of the user's hand lacks motion (within a suitable threshold) for a threshold period of time. That is, controller 20 can ascertain selection of a displayed virtual input when a user brings a portion of their hand into proximity (within a threshold) with the displayed virtual input and then does not move (for a threshold period) and the proximity element of this selection can be fed back to the user based on the size of the indicia being the same as the size of the virtual input when the user has brought the portion of their hand into sufficient proximity.

Display 60 may optionally comprise one or more visible light sources in addition to or as an alternative to a flatscreen display. Controller 20 may be configured to generate display signals 61 that cause display 60 to illuminate or change a color of illumination of at least one of the visible light sources according to, for example, the estimated location of a portion of the user's hand in a plane (e.g. an x-y plane) corresponding to a plane of display 60, a plane tangential to a surface of display 60 or a plane tangential to some other suitable surface of target device 50 and/or retrofit interface apparatus 10 and/or the estimated proximity of a portion of the user's hand to such as plane.

In some embodiments, controller 20 is configured to generate display signals 61 which cause display 60 to provide feedback (or otherwise alter the output of display 60) based at least in part on an estimated line of sight vector of the user. In such embodiments, display signals 61 may cause display 60 to display an image that is skewed in a direction toward or away from the user based on the estimated line of sight vector. Advantageously, causing display 60 to display a "skewed" image can help the user avoid inaccurate touchless interaction with retrofit interface system 10 which may otherwise be caused by, for example, the user's angle of view and perspective relative to display 60 and/or the virtual inputs displayed thereon. By skewing the virtual input's location (or the detection zone of the virtual input) based on the estimated line of sight vector of the user, the user's probability of accurately interacting with touchless sensing system 12 (e.g. selecting a particular virtual input) will increase. In some embodiments, controller 20 may generate display signals 61 which cause display 60 to display a skewed indicia (e.g. a cursor) to accommodate the perspective of the user (as determined by the estimation of the user's line of sight).

Retrofit interface apparatus 10 may optionally include additional visual indicators (as part of feedback mechanism 55) that help notify the user of selections, finger/hand presence, etc. For example, retrofit interface apparatus may include lights (e.g. light emitting diodes) that turn ON to indicate a successful tap/wave of the finger/hand. The lights may be synchronized with display 60 to provide visual feedback together to the user. For example, display 60 may be configured to display various icons, images and/or text for various keypad numbers or other possible selections and the lights may be configured to indicate finger presence and/or successful selections.

Retrofit interface apparatus 10 may additionally or alternatively comprise feedback mechanisms 55 that support auditory feedback. The auditory feedback mechanisms may be configured (e.g. with suitable feedback signals 57 from a suitably programmed controller 20) to provide sound cues that indicate successful touchless selections or other interactions between a user and retrofit interface apparatus 10 (e.g. touchless sensing system 12). For example, a sound cue could be produced when touchless input corresponding to alphanumeric text is entered by a user (e.g. a suitable finger pressing gesture is detected by touchless sensing system 12)—either to simply indicate a button press or to repeat the input that was entered (e.g. "9", "m"). The auditory feedback mechanism may include a speaker. The speaker could be used to notify the user of system states and/or changes of system states for retrofit interface apparatus 10 and/or target device 50, such as, by way of non-limiting example, when a user presence is detected, when the system is waiting for user input, when a user has reached a "main menu" or "sub-menu X" and/or the like.

As discussed elsewhere herein, retrofit interface apparatus 10 receives touchless input from a user (via touchless sensing system 12) and uses such touchless input to provide corresponding input to target device 50. A number of non-limiting example embodiments are now described as to how retrofit interface apparatus 10 may determine particular touchless input. These examples may comprise additional or alternative techniques to those described elsewhere herein. In some exemplary embodiments, capacitive sensors 30, optical sensing system 40 and/or or other sensors that form part of touchless sensing system 12 may detect motion of a body part (e.g. finger) of a user. In some embodiments, feedback mechanism 55 provides visual feedback via a display (which may include a display 60 that is part of retrofit interface apparatus 10 and/or a display 22 that is part of target device 50). Such visual feedback may comprise displaying visual indicia corresponding to the location characteristics detected and/or detectable by capacitive sensors 30, optical system 40 and/or other sensors that form part of touchless sensing system 12.

Figure 5A:
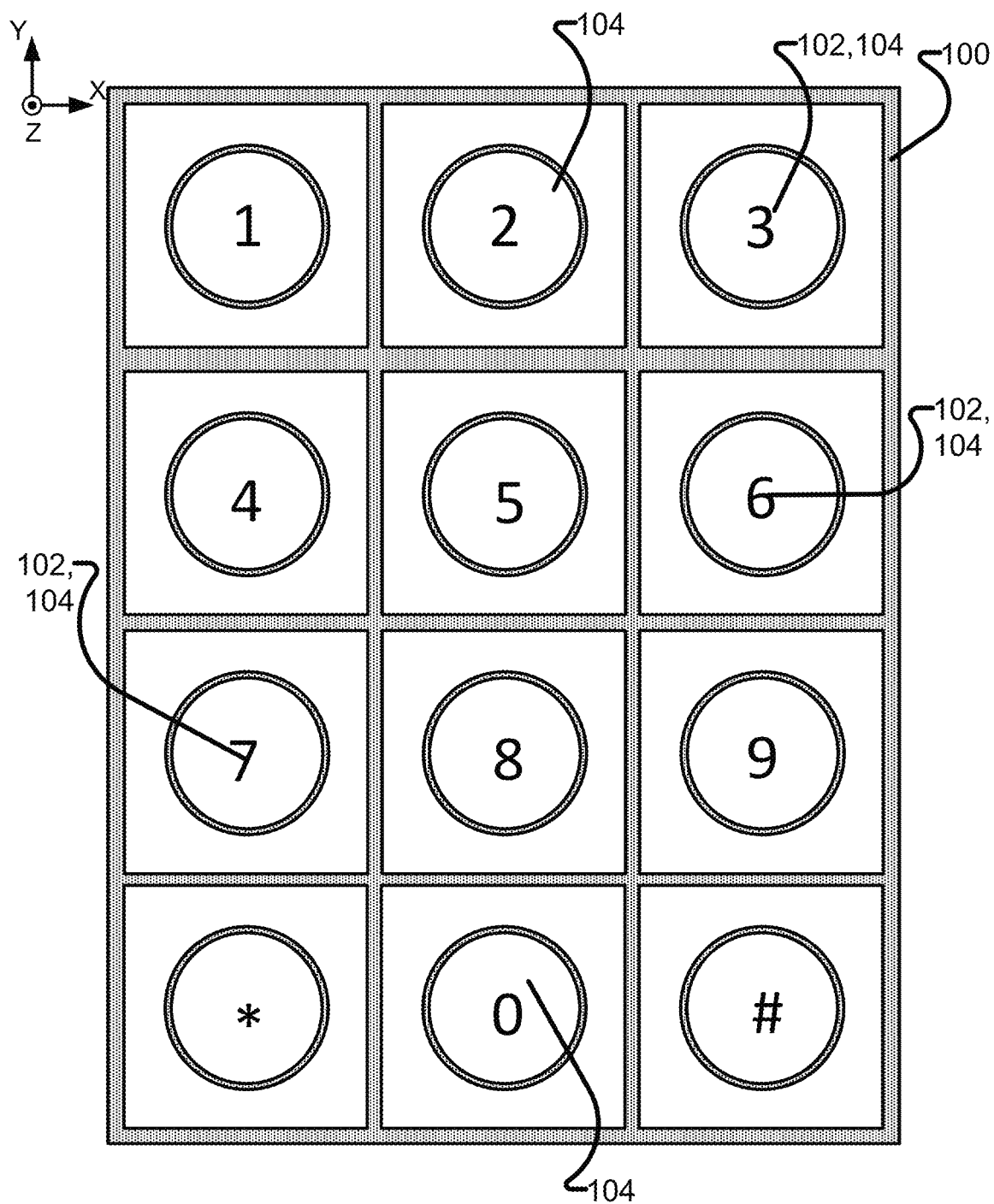
FIGS. 5A, 5B show front and side views of a panel of the FIG. 1 retrofit user interface apparatus (or any of the other retrofit user interface apparatus described herein) displaying virtual buttons according to an example embodiment.
Figure 5B:
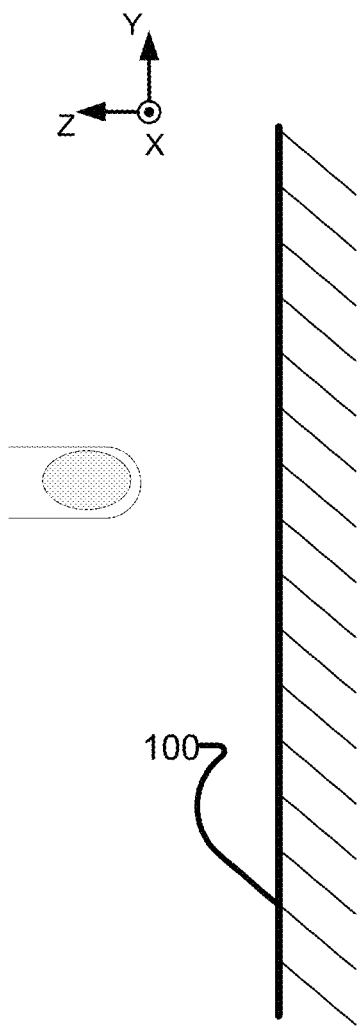

FIGS. 5A, 5B show front and side views of a panel 100 of retrofit user interface apparatus 10 (or any of the other retrofit user interface apparatus 10A, 10B, 10C described herein) displaying virtual buttons 104 according to an example embodiment. As shown schematically in FIGS. 5A, 5B, retrofit interface apparatus 10 may comprise a panel 100 labelled with icons, graphics or text 102 which may be used to represent, for example, buttons on a keypad or other selectable buttons or inputs 104. Such icons, graphics or text may be considered to be virtual buttons or inputs 104 that operate touchlessly and/or that exist only on panel 100 (as opposed to being physical buttons). Such a panel 100 displaying virtual buttons or inputs 104 may comprise a display (e.g. a display that is part of feedback mechanism 55, including, for example, a display 60 that is part of retrofit interface apparatus 10 and/or display 22 of target device 50). Such a panel 100 displaying virtual buttons or inputs 104 may additionally or alternatively comprise a static panel or surface that displays static virtual buttons or inputs 104. For the exemplary touchless input selection embodiments described below, it is assumed without loss of generality that there is a panel 100 on which various virtual buttons 104 are visible to the user and labelled with icons and/or alphanumeric text 102, so that the user may see the virtual buttons 104. FIGS. 5A, 5B also show Cartesian axes x, y and z which are used to describe directions in the following description of exemplary touchless input selection, with x and y being orthogonal transverse directions and the z-direction being generally normal to panel 100.

For brevity, the exemplary touchless input selection embodiments described herein refer to virtual buttons 104 being shown on display 60 of retrofit interface apparatus 10 which may be controlled by controller 20 (via display signals 61) without loss of generality that the functionality described as being associated with display 60 may additionally or alternatively be provided by display 22 that is part of target device 50 which may controlled by controller 20 (via display signals 18 and/or indirectly via control signals 16 and display signals 21) or that such virtual buttons are displayed on a static panel or surface. The exemplary touchless input selection embodiments described below provide techniques by which retrofit interface apparatus 10 may determine (or conclude) that a particular virtual button 104 has been touchlessly selected by a user. As explained elsewhere herein, retrofit interface apparatus 10 may use the determination of the selection of such a virtual button 104 to effect corresponding operation of target device 50.

Figure 6:
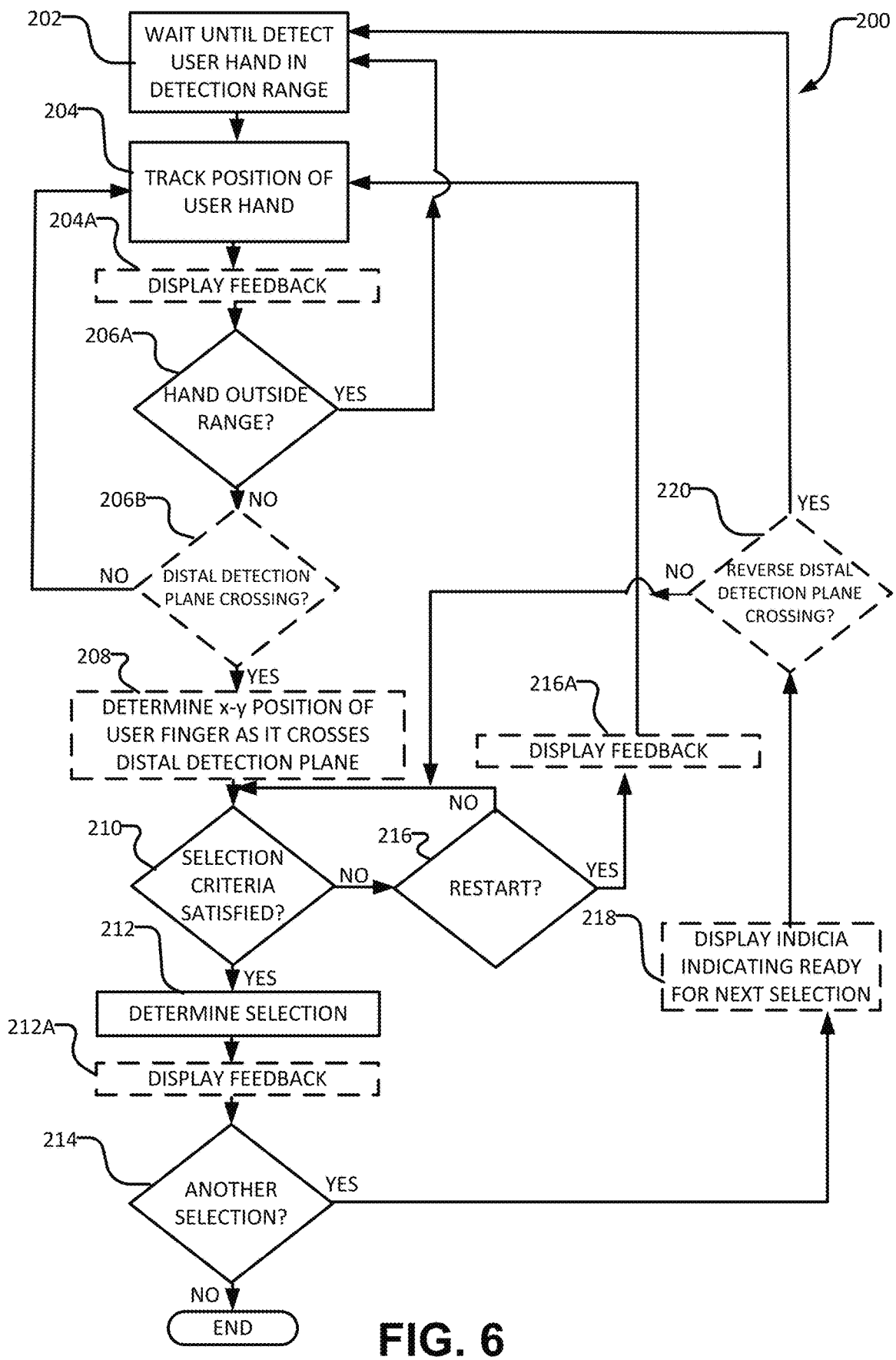
FIG. 6 is a schematic depiction of a method for determining a touchless input selection using any of the retrofit interface apparatus described herein according to a particular example embodiment.

FIG. 6 is a schematic depiction of a method 200 for determining a touchless input selection using retrofit interface apparatus 10 (or any other retrofit interface apparatus 10A, 10B, 10C described herein) according to a particular example embodiment. For the purposes of explaining the FIG. 6 method 200, it is assumed that touchless sensing system 12 comprises a combination of an array of capacitive sensors 30 and an optical sensing system 40 similar to that shown in the embodiment of FIGS. 3A-3C and that the selection of an input involves interacting with a virtual button 104 as described elsewhere herein. Method 200 may be implemented by touchless sensing system 12 in combination with controller 20 and, optionally, feedback mechanism(s) 55.

Method 200 starts in block 202, where touchless sensing system 12 waits for a user body part (assumed, without loss of generality, for the purposes of explaining method 200 to be a finger) to enter its detection range. In some embodiments, the block 202 involves detecting that the user's finger has entered a sensing region 32 of capacitive sensors 30, which sensing region may be a z-distance away from a plane displaying one or more virtual buttons 104, where the z-coordinate may be normal to the plane displaying virtual button 104. Once touchless sensing system 12 detects a user's finger in its sensing region 32, method 200 proceeds to block 204, where touchless sensing system 12 (e.g. capacitive sensors 30) tracks the position of the user's finger as it moves in the sensing region 32. In some embodiments, block 204 may involve tracking only the z-coordinate of the finger. In some embodiments, block 204 may involve tracking the transverse (x-y) coordinates of the user's finger in addition to the z-coordinate. In block 204A, controller 20 optionally provides some sort of feedback using feedback mechanism 55 when the user's finger is detected in sensing region 32. For example, controller 20 may cause display 60 (or display 22) to display a cursor or the like which tracks the transverse (x-y) location of the user's finger and which has some indicia (e.g. size, color or the like) indicative of the z-coordinate of the user's finger.

In block 206A, method 200 inquires whether the user's finger has withdrawn outside of sensing region 32. If so, then method 200 returns to block 202. If the user's finger is still in sensing region 32, then method 200 proceeds to optional block 206B. Optional block 206 involves an inquiry as to whether the user's finger has crossed a detection plane. A detection plane may be implemented using a threshold z-coordinate. That is, if sensing system 12 ascertains that the z-coordinate of the user's finger has gone from above a configurable threshold to below a configurable threshold, then a detection plane crossing is detected in block 206B. If no detection plane crossing is detected in block 206B, then method 200 returns to block 204. If, however, a detection plane crossing is detected in block 206B, then method 200 proceeds to optional block 208. In block 208, the transverse (x-y) position of the user's finger is determined when the user's finger crosses the detection plane. This block 208 determination may be performed by optical sensors 40, which may permit more accurate determination of the transverse (x-y) coordinates (when compared to capacitive sensors 30), as described elsewhere herein.

Whether arriving via optional blocks 206B and 208 or directly from block 206A, method 200 involves ascertaining whether particular selection criteria are satisfied in block 210. As described elsewhere herein, a variety of techniques may be used to discriminate whether selection criteria are satisfied in block 210. Such techniques may be based, generally, on the tracked locations of a user body part (e.g. a user's finger) determined by touchless sensing system 12 (e.g. capacitive sensors 30 and/or optical sensing system 40). In one particular embodiment, block 210 involves determining that a selection is made when the user's finger crosses another detection plane (similar to the detection plane discussed above in relation to blocks 206B and 208). In other particular embodiments, the block 210 selection criteria could involve detection of a tap-gesture, a double-tap gesture, a hover gesture and/or the like, some examples of which are described below. If the block 210 selection criteria are satisfied, then method 200 proceeds to block 212 which involves determining which selection (e.g. which particular virtual button 104) has been made. Depending on the nature of the selection criteria which are satisfied in block 210, the block 212 selection determination may be made as part of the block 210 inquiry.

In some embodiments, each virtual button 104 has a range of corresponding transverse (x-y) coordinates and block 212 comprises selecting the particular virtual button 104 which corresponds to the tracked x-y position of the user's finger when the block 210 selection criteria were satisfied or to the determined x-y position of the user's finger when it crossed the detection plane in block 208. In some embodiments, block 212 may take into consideration the angle of approach of the user's finger. Such an angle of approach may be determined, for example, by capacitive sensors 30 as they track the user's finger between blocks 204 and 210. Such an angle of approach may be determined between the x-y location of a first detection plane crossing (as determined in block 208) and the x-y location of a second detection plane crossing (as determined in block 210 when the selection criteria are satisfied). If an angle of approach (relative to the z-direction) is greater than a threshold angle, then block 212 may involve determining that the user was trying to select an adjacent virtual button 104 (i.e. a virtual button adjacent to the virtual button corresponding to the tracked x-y position of the user's finger when the block 210 selection criteria were satisfied or to the determined x-y position of the user's finger when it crossed the detection plane 208). In some embodiments, block 212 involves the calculation of a tap-vector based on a pair of (x, y, z) detections $(x_1, y_1, z_1)$, $(x_2, y_2, z_2)$. These two separate detections can be utilized to get a vector in space and then predict a virtual button that the user was trying to select. By way of non-limiting example, such a pair of (x, y, z) detections can involve: a laser optical sensor for each detection—a detection occurs when the detection-plane of sensor A is hit and then another detection when the detection-plane of sensor B is hit. The z-coordinate can be calculated by knowledge of the angle of the optical sensor(s) or by capacitive sensors 30. In general, any combination of information from capacitive sensors 30 and/or optical sensors 40 described herein may be used to make one or both of the pairs of (x, y, z) detections. In some embodiments, a suitable temporal threshold may be used between pairs of (x, y, z) detections to discriminate whether the user was making the gesture on purpose.

In block 212A, controller 20 may optionally cause feedback mechanism 55 to display some sort of feedback indicating that a virtual button 104 was selected by the user. For example, controller 20 may cause an icon associated with the virtual button to change color, to display or to change an animation and/or the like. Method 200 then proceeds to block 214 which involves an inquiry as to whether retrofit interface system 10 is waiting for additional input from the user. For example, if target device 50 is an elevator panel, and the user has pressed a virtual button corresponding to the 8th floor, then no further input is required. If, however, target device 50 is an airport kiosk and the user has entered the first letter of their last name, then retrofit interface system 10 may require more input. If the block 214 inquiry is negative, then method 200 ends. Otherwise, method 200 returns to either to block 202 or to block 210 via optional blocks 218 and 220. In optional block 218, controller 20 may cause feedback mechanism to indicate that retrofit interface apparatus is waiting for further input. Optional block 220 involves an inquiry whether the user's finger has retracted (away from the virtual buttons) past the detection plane evaluated in blocks 206B and 208. If the block 220 inquiry is negative, then method 200 returns to block 210. If the block 220 inquiry is positive, the method 200 returns to block 202.

Returning to the inquiry of block 210, there is a possibility that selection criteria are not satisfied in which case, method 200 proceeds to block 216. Block 216 may involve an inquiry as to whether a restart is desired. If no restart is desired, then method 200 returns to block 210. If a restart is desired then suitable restart feedback may be displayed (block 216A) and method 200 may return to block 204. Restart criteria evaluated in block 216 may comprise, for example, suitable temporal thresholds, a determination that a reverse crossing of the block 206B, 208 detection plane has been detected and/or the like.

As discussed elsewhere herein, touchless sensing system 12 (e.g. capacitive sensors 30 and/or optical sensing system 42) is able to detect x, y and z positions (see FIGS. 3A, 5A, 5B) of a user body part (e.g. a user finger). An example method for touchless input selection criteria that may be used, for example, in block 210 of method 200, involves the user pointing their finger over (e.g. sufficiently proximate to (within a threshold z-distance (see FIGS. 3A, 5A, 5B) and at the correct transverse (x-y) location relative to) a particular virtual button 104 and hovering (without changing the x, y, z positions of their finger by more than a threshold amount (e.g. 0.5 cm or 1 cm) for a threshold period of time (e.g. 0.5 s or 1 s). In other embodiments, selection criteria for a virtual button or icon 104 that may be used in block 210 may involve determining that a user has moved their finger first to within a threshold distance (e.g. z-distance) from a virtual button 104 (as determined by the transverse (x-y) position of the finger) for a threshold period of time and then detecting a rapid change in the z-position of the finger (i.e. moving their finger toward or away from the virtual button 104) with a threshold change in z-position within a threshold time period (e.g. more than 1 cm of z-direction change in less than 0.25 s) and/or with a rate of z-position change greater than a suitable threshold (e.g. a rate of z-position change greater than 4 cm/s).

Display 60 may display a visual indicia or an animation (e.g. a loading bar/circle) or other types of feedback (e.g. including those described elsewhere herein) may be provided by feedback mechanism 55 to indicate that the selection has been made (e.g. in block 212A) and that the finger can be moved to a new position (e.g. in block 218). In some embodiments, feedback mechanism 55 of retrofit interface apparatus 10 used in block 212A comprises an sonic emitter that directs an sonic wave toward, for example, the user's finger to signify (provide feedback corresponding to) a selection.

The example hover selection touchless input selection technique may be used (e.g. in block 210) in addition to or in the alternative to any of the other touchless input techniques described herein.

Another example method of touchless input selection criteria that may be used, for example, in block 210 of method 200 for determining selection of a virtual button 104 involves the user hovering over (e.g. sufficiently proximate to (within a threshold z-distance) and at the correct transverse (x-y) location relative to) a virtual button or icon 104 for a threshold period of time and subsequently tapping their finger further (in the z-direction) towards the virtual button 104. The tapping motion may comprise the user moving their finger further toward the virtual button 104 (e.g. to within a closer threshold distance in the z-direction), followed by moving or releasing their finger away from the virtual button 104. Touchless sensing system 12 (e.g. capacitive sensors 30 and/or optical sensing system 40) may detect a hover over a particular virtual button which may be a qualifying event for a subsequent tapping event. Then, if the x-y positions do not change (by more than a threshold amount) and the z-direction is detected to decrease (e.g. by a threshold amount compared to the z value during the hover detection), then a "tap" is identified.

This example method may also include tapping and dragging the finger laterally after the initial hover. By way of non-limiting example, a first identified tap may be used to engage the dragging (e.g. of an icon) and then subsequent x-y movement of the finger could be used to implement the dragging until a subsequent tap, an increase in the z-coordinate and/or the like is used to release the dragging.

Another example method of touchless input selection criteria that may be used, for example, in block 210 of method 200 for determining selection of a virtual button 104 involves the user double-tapping a virtual button or icon. This method of selection potentially allows for quicker interaction with the retrofit interface apparatus 10 (when compared to hover selection discussed above). The double-tap method of selection involves the user tapping their finger towards and away from the virtual button 104 (at the transverse location of the virtual button) two times within a threshold period of time to input a selection. Touchless sensing system 12 (e.g. capacitive sensors 30 and/or optical sensing system 40) may detect such double-tapping in manner similar to the detection of a first tap (described above) and then detecting an increase in the z-position followed by a second tap within a threshold period of time. Double-tapping advantageously allows for increased robustness and reduction of false-positive or accidental clicks of a virtual button relative to the above-discussed hover-type selection criteria, since some users may naturally hover over particular virtual buttons when they are trying to decide which button to select. In some embodiments, the block 210 selection criteria may involve a combination of the double-tapping method with the hover selection method described above. For example, a user may use the hover selection method to first pre-select an icon, followed by using the double-tapping method (or a single tapping method as an alternative) to confirm a selection.

Another example method of touchless input selection criteria that may be used, for example, in block 210 of method 200 for determining selection of a virtual button 104 involves the user pointing their finger toward a virtual button or icon and making a motion of a circle (i.e. drawing a circle) around the virtual button or icon that they wish to select. In some such embodiments, touchless sensing system 12 may track the transverse x-y position of the user's finger, once the finger enters a threshold z-distance proximity to a virtual button. While tracking, touchless sensing system 12 may check if the transverse position of the finger changes by a threshold amount, then comes back to within a threshold proximity of the same position within a configurable time-threshold (e.g. 1 s). If that is true, touchless sensing system 12 analyses the shape that has been made while tracking that transverse position. One example and non-limiting method for determining if the motion is a circle or some other "closed" shape involves checking if the motion sequentially traverses through four Cartesian quadrants during its motion (e.g. by detecting four "corner" points, which may correspond to extremities of particular coordinate) and ascertaining if these corner points lie in four separate quadrants) and that there is a minimum threshold radius or threshold separation between opposing corner points. It will be appreciated that other techniques could be used for ascertaining whether the user's finger traverses a closed shape. Touchless sensing system 12 may additionally check if the x-y coordinates of a virtual button are fully or partially enclosed inside a detected circle before confirming a selection of a particular virtual button. In some embodiments, display 60 is configured to provide feedback which shows the circle as it is being drawn around the selected virtual button or icon. Such feedback may be provided, for example, prior to the YES conclusion that the selection criteria has been satisfied in block 210.

Another example method of touchless input selection involves the user positioning their finger over a "ring" indicator (or other suitable "selector" indicator) which may be displayed on display 60 and then subsequently "dragging" the selector indicator over to the virtual button 104 they wish to select. In some such embodiments, touchless sensing system 12 may first detects a hover gesture proximate to the ring indicator—and may interpret this action as activating the ring to move with the finger. Then, touchless sensing system 12 may track the transverse x-y position of the finger as it moves over a virtual button. Then, touchless sensing system 12 may detect a hover gesture, a moving away gesture (z-distance increase by certain threshold amount in threshold amount of time) or some other suitable gesture to select the virtual button corresponding to the x-y position of the ring. The block 210 selection criteria may then determine selection of a virtual button 104 by determining that the user has held the selector indicator over the virtual button or icon 104 for a threshold period of time or by pulling the finger away from the virtual button 104 (e.g. in the z-direction) after the selector indicator has been dragged over the virtual button or icon 104. Advantageously, like the double-tap method described above, this method may mitigate false-positives and user-error, relative to hover-based selection, since, like double-tapping, this ring-selection technique requires deliberate user action.

Another example method of touchless input selection criteria that may be used, for example, in block 210 of method 200 for determining selection of a virtual button 104 involves the user waving or swiping their hand across the surface of the touchless sensing system 12. In some such embodiments, touchless sensing system 12 first ensures that the user's body part is sufficiently close (within a z-distance threshold) and then tracks the transverse (x-y) location of the portion of the user's body part (e.g. finger, hand, forearm) over a threshold amount of time (e.g. 1 s). If the change in transverse position of the user's body part is larger than a configurable threshold within the threshold amount of time or the rate of transverse change during the threshold transverse movement is higher than a configurable threshold, then a swipe is detected. In some implementations, the directionality of swipe may be ascertained by touchless sensing system 12 by detecting that the swipe movement is closest to one of the left (negative x)/right (positive x)/up (positive y)/down (negative y) directions. We assume the hand is within the detection range of the sensor the entire time. There must be a threshold change-in-distance for a valid swipe to be identified. In some embodiments, the detection of swiping may be used as a navigational gesture (e.g. to change between sets of virtual buttons) in addition to or as an alternative to being used as a technique for selection of a virtual button in block 210 of method 200

Another example method of touchless input selection criteria that may be used, for example, in block 210 of method 200 for determining selection of a virtual button 104 involves the user making a circular motion with their hand to cycle or scroll through selections, manipulate a slider widget, select a number value, or adjust a setting (e.g.

temperature on a thermostat). In some such embodiments, touchless sensing system 12, first ensures that the user's body part is sufficiently close (within a z-distance threshold) and then tracks the transverse x-y position of the finger/hand to ascertain whether a consistent circular motion is being made. This circular motion can be ascertained in a manner similar to the circle selection described above. In some embodiments, the radius and speed of motion can be tracked to ascertain the speed of cycling though selections, etc. In some embodiments, tracking these rotations may involve: an assumption that they are circular in motion; detecting and calculating velocity vectors of the instantaneous motion; and then calculating cross product vectors based on the current and previous velocity vectors—the directions of these cross-products yields directional information and the magnitudes of these cross-products yield speed information. In some embodiments, the detection of circular motion may be used as a navigational gesture (e.g. to change between sets of virtual buttons) in addition to or as an alternative to being used as a technique for selection of a virtual button in block 210 of method 200.

Selection of a virtual button or icon may include selection of interactive virtual icons, such as a slider button and/or the like. A virtual slider button may comprise a slider icon that can be "dragged" over a range of motion. In one particular embodiment implementing a virtual slider button, an interaction with a virtual slider button may involve: touchless sensing system 12 detect a finger satisfying selection criteria over the slider icon (hover, hover-tap, double-tap, etc.), and as long as it detects the z-distance to not increase (by more than a threshold amount), touchless sensing system tracks the transverse x-y position to affect the slider to drag left/right or up/down on the screen. Interaction is finished once the finger z-distance is detected to increase beyond a threshold.

In some embodiments, display 60 is configured to display a keyboard (e.g. virtual buttons 104 correspond to the keys of a keyboard) and touchless sensing system 12 is configured to detect the user swiping their finger across (but spaced apart from) the surface of display 60 between various alphanumeric icons to type out words. Touchless sensing system 12 may detect such swiping as a series of swipes and may track the end-points of the swiping as the keys of the keyboard that are pressed. After a threshold period of inactivity or detection of some other suitable gesture (e.g. a moving away in the z-direction and/or the like), the detected end points can form an alphanumeric string. Controller 20 may support a predictive algorithm that may be employed to anticipate which words are desired to be inputted based on the proximity and end-points of the motion of the user's finger.

In some embodiments, touchless sensing system 12 is configured to detect a motion of a finger made by a user and controller 20 is configured to interpret the motion. For example, a user could draw a '2' or 'd' or even a whole word or code such as 'open' or '1234' using the motion of their finger. Once the user's finger is within a threshold z-distance, touchless sensing system could track the transverse (x-y) position of the user's finger; when a moving-away gesture (or some other suitable gesture) is detected, one of a variety of character recognition (CR) or similar algorithms can be employed to identify which alphanumeric input was drawn. Multiple numbers/characters can be detected together to form a word or passcode. In some embodiments, the position of the user's finger and the motion of the finger (i.e. what the user wrote) is displayed on screen 60.

In some embodiments, controller 20 is configured to cause display 60 to display a warning message when the estimated proximity of a portion of the user's hand (e.g. finger) is too close to panel 100. This can discourage touching of the surface of panel 100 (to prevent infection transmission from contact-based viral transmission) for users that are not familiar with touchless sensing system 12. This can also discourage the finger from approaching too closely to panel 100 to reduce inaccuracies in the sensor's detection capabilities, which may arise, for example, when controller 20 is tuned for detection of a relatively thin finger and the user's hand or forearm comes within the sensing range, leading to potentially inaccurate results.

The sensors of touchless sensing system 12 (e.g. capacitive sensors 30) may be configured to determine 3D (x, y, z) coordinates corresponding to the positions of a body part (e.g. finger). Using such 3D coordinates, controller 20 may be configured to detect and interpret different and custom gestures as inputs to retrofit interface apparatus 10. Examples of the custom gestures include, but are not limited to, arbitrary shapes such as a figure eight, triangle, letters, circular loops, etc.

Figure 6A:
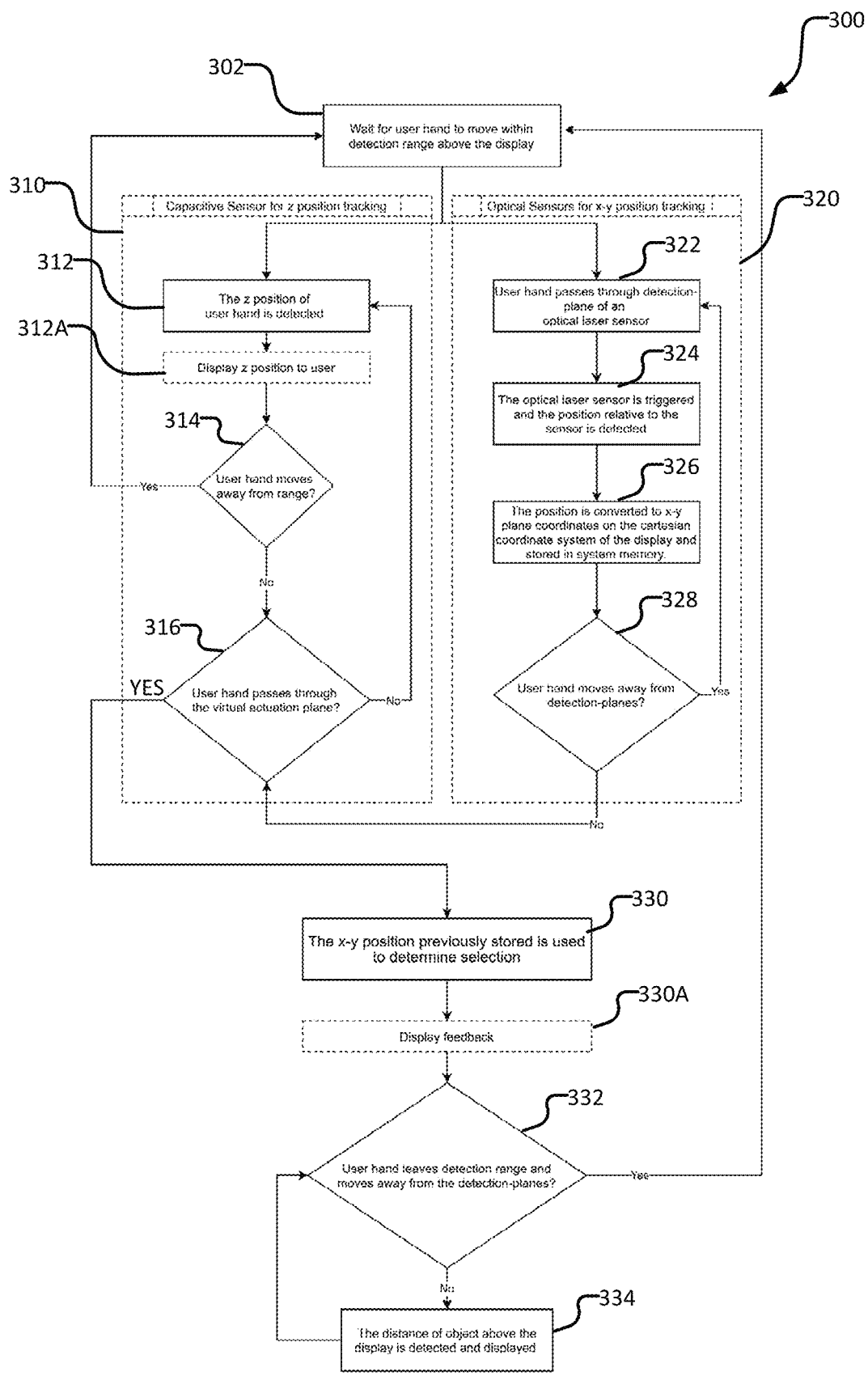
FIG. 6A is a schematic depiction of a method for determining a touchless input selection using any of the retrofit apparatus described herein according to another example embodiment.

FIG. 6A is a schematic depiction of a method 300 for determining a touchless input selection using any of the retrofit apparatus 10, 10A, 10B, 10C described herein according to another example embodiment. Method 300 is a particular embodiment, where touchless sensing system 12 comprises the capacitive sensors 30 and optical sensors 42A, 42B discussed above in connection with FIGS. 3A-3C. The flow chart illustration of method 300 is broken down logically into two parts: part 310 which is performed by capacitive sensors 30 and part 320 which is performed by optical sensors 40. Method 300 starts in block 302 which is analogous to block 202 described above and involves waiting for the user's body part (e.g. finger or hand) to move into sensing region 32. For brevity and without limiting the generality of the description, the remainder of method 300 is described in connection with the user's finger being the relevant body part.

Once the user's finger enters sensing region 32, in part 310, central capacitive sensor 30 detects and tracks the z coordinate of the finger (block 312) and may be optionally displayed to the user (block 312A) as the finger approaches the plane of a virtual button 104 or display 60/22 or moves away from this plane. If the user's finger moves out of detection region 32 (block 314 YES branch), then method 300 returns to block 302. If the user's finger moves through a detection plane (crosses from above a configurable z coordinate to below the configurable z coordinate), then method proceeds via the block 316 YES branch to block 330. In this sense, block 316 may be analogous to the block 210 determination of whether selection criteria are satisfied with the selection criteria of method 300 being the crossing of a detection plane. As such, the block 316 detection plane may be referred to as an actuation plane. In other embodiments, block 316 could additionally or alternatively make use of any of the other block 210 selection criteria described herein.

Meanwhile, in part 320, the optical sensors 42A, 42B (see FIG. 3A) beside the plane of virtual button 104 or display 60/22 emit two detection-planes of laser-light at an angle relative to the plane of virtual button 104 or display 60/22. When a user's finger crosses through a detection plane (block 322), as determined by the finger crossing a detection plane of one or both of optical sensors 42A, 42B and/or as determined by comparing the z-coordinate measured by capacitive sensor 30 to a suitable threshold, then optical sensors 42A, 42B are trigged and the transverse (x-y) position of the user's finger is determined (blocks 324, 326) as described elsewhere herein. The block 322 detection plane may be the same as the block 316 actuation plane or may be different than the block 316 actuation plane. For example, the block block 316 actuation plane may be further from the user than an intersection of the detection planes of optical sensors 42A, 42B (see intersection 56 shown in FIG. 3A). With this configuration, an optical detection (in blocks 322, 324, 326) will occur before method 300 reaches block 316. If the user moves their finger away from the detection plane of block 322 (block 328 YES branch), then method 300 returns to block 322.

If the block 316 inquiry is positive (i.e. the user's finger crosses the actuation plane), then method 300 proceeds to block 330. Block 330 may determine an input (e.g. virtual button) selection based on the x-y position ascertained in block 326. In this sense, block 330 may be analogous to block 212 of FIG. 6. Feedback regarding the block 330 selection may be provided by feedback mechanism 55 at block 330A. if the user moves their hand away from the sensing region 32 (block 332 YES branch), then method 300 returns to block 302. Otherwise the z coordinate is displayed (block 334) and the method returns to block 332.

Particular embodiments described and claimed herein provide retrofit touchless interface apparatus 10 for use to retrofit to target devices 50 having touch-based inputs 50A to provide target devices with touchless user input. This is not necessary. It will be appreciated by those skilled in the art that some embodiments may be suitably modified to provide custom and/or modular touchless interfaces for directly facilitating the interaction of humans with machines or other devices. That is, retrofit interface apparatus 10 and target device 50 may be integrated into a newly manufactured device. In some such newly manufactured devices, some aspects of the retrofit interface apparatus 10 and target device 50 that are described as independent herein may be merged. For example, controller 20 of retrofit interface apparatus 10 and control system 51 of target device 50 may be merged into a one functional controller. As another example, display 60 of retrofit interface apparatus 10 and display 22 of target device 50 may be merged into a single display. Some such newly manufactured devices could comprise touchless sensing systems 12 similar to those described herein.

Interpretation of Terms

Unless the context clearly requires otherwise, throughout the description and the claims:
"comprise", "comprising", and the like are to be construed in an inclusive sense, as opposed to an exclusive or exhaustive sense; that is to say, in the sense of "including, but not limited to";
"connected", "coupled", or any variant thereof, means any connection or coupling, either direct or indirect, between two or more elements; the coupling or connection between the elements can be physical, logical, or a combination thereof;
"herein", "above", "below", and words of similar import, when used to describe this specification, shall refer to this specification as a whole, and not to any particular portions of this specification;
"or", in reference to a list of two or more items, covers all of the following interpretations of the word: any of the items in the list, all of the items in the list, and any combination of the items in the list;
the singular forms "a", "an", and "the" also include the meaning of any appropriate plural forms.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", and the like, used in this description and any accompanying claims (where present), depend on the specific orientation of the apparatus described and illustrated. The subject matter described herein may assume various alternative orientations. Accordingly, these directional terms are not strictly defined and should not be interpreted narrowly.

Some components of various embodiments of the invention (including, by way of non-limiting example, controller 20 of the retrofit interface apparatus 10, 10A, 10B, 10C control system 51 of target apparatus 50 or any other controller described herein) may be implemented using specifically designed hardware, configurable hardware, programmable data processors configured by the provision of software (which may optionally comprise "firmware") capable of executing on the data processors, special purpose computers or data processors that are specifically programmed, configured, or constructed to perform one or more steps in a method as explained in detail herein and/or combinations of two or more of these. Examples of specifically designed hardware are: logic circuits, application-specific integrated circuits ("ASICs"), large scale integrated circuits ("LSIs"), very large scale integrated circuits ("VLSIs"), and the like. Examples of configurable hardware are: one or more programmable logic devices such as programmable array logic ("PALs"), programmable logic arrays ("PLAs"), and field programmable gate arrays ("FPGAs")). Examples of programmable data processors are: microprocessors, digital signal processors ("DSPs"), embedded processors, graphics processors, math co-processors, general purpose computers, server computers, cloud computers, mainframe computers, computer workstations, and the like. For example, one or more data processors in a control circuit for a device may implement methods as described herein by executing software instructions in a program memory accessible to the processors.

Processing may be centralized or distributed. Where processing is distributed, information including software and/or data may be kept centrally or distributed. Such information may be exchanged between different functional units by way of a communications network, such as a Local Area Network (LAN), Wide Area Network (WAN), or the Internet, wired or wireless data links, electromagnetic signals, or other data communication channel.

For example, while processes or blocks are presented in a given order, alternative examples may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times.

In addition, while elements are at times shown as being performed sequentially, they may instead be performed simultaneously or in different sequences. It is therefore intended that the following claims are interpreted to include all such variations as are within their intended scope.

Software and other modules may reside on servers, workstations, personal computers, tablet computers, image data encoders, image data decoders, PDAs, color-grading tools, video projectors, audio-visual receivers, displays (such as televisions), digital cinema projectors, media players, and other devices suitable for the purposes described herein. Those skilled in the relevant art will appreciate that aspects of the system can be practised with other communications, data processing, or computer system configurations, including: Internet appliances, hand-held devices (including personal digital assistants (PDAs)), wearable computers, all manner of cellular or mobile phones, multi-processor systems, microprocessor-based or programmable consumer electronics (e.g., video projectors, audio-visual receivers, displays, such as televisions, and the like), set-top boxes, color-grading tools, network PCs, mini-computers, mainframe computers, and the like.

In some embodiments, the invention may be partially implemented in software. For greater clarity, "software" includes any instructions executed on a processor, and may include (but is not limited to) firmware, resident software, microcode, and the like. Both processing hardware and software may be centralized or distributed (or a combination thereof), in whole or in part, as known to those skilled in the art. For example, software and other modules may be accessible via local memory, via a network, via a browser or other application in a distributed computing context, or via other means suitable for the purposes described above.

Where a component (e.g. a software module, processor, assembly, device, circuit, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

Specific examples of systems, methods and apparatus have been described herein for purposes of illustration. These are only examples. The technology provided herein can be applied to systems other than the example systems described above. Many alterations, modifications, additions, omissions, and permutations are possible within the practice of this invention. This invention includes variations on described embodiments that would be apparent to the skilled addressee, including variations obtained by: replacing features, elements and/or acts with equivalent features, elements and/or acts; mixing and matching of features, elements and/or acts from different embodiments; combining features, elements and/or acts from embodiments as described herein with features, elements and/or acts of other technology; and/or omitting combining features, elements and/or acts from described embodiments.

Various features are described herein as being present in "some embodiments". Such features are not mandatory and may not be present in all embodiments. Embodiments of the invention may include zero, any one or any combination of two or more of such features. This is limited only to the extent that certain ones of such features are incompatible with other ones of such features in the sense that it would be impossible for a person of ordinary skill in the art to construct a practical embodiment that combines such incompatible features. Consequently, the description that "some embodiments" possess feature A and "some embodiments" possess feature B should be interpreted as an express indication that the inventors also contemplate embodiments which combine features A and B (unless the description states otherwise or features A and B are fundamentally incompatible).

It is therefore intended that the following appended claims and claims hereafter introduced are interpreted to include all such modifications, permutations, additions, omissions, and sub-combinations as may reasonably be inferred. The scope of the claims should not be limited by the preferred embodiments set forth in the examples, but should be given the broadest interpretation consistent with the description as a whole.

What is claimed is:

1. A retrofit interface apparatus for interfacing with a target device to provide the target device with touchless user input, the apparatus comprising:
   a touchless sensing system comprising one or more sensors responsive to touchless input made by a human user and for generating one or more corresponding sensor input signals;
   a controller connected to receive the one or more sensor input signals from the touchless sensing system and configured to generate, based on the one or more sensor input signals, a corresponding control signal;
   the controller connectable to the target device to bypass a touch-based input of the target device and to provide the control signal as an input to an existing control system of the target device to thereby cause the control system of the target device to operate the target device based on the control signal;
   wherein the touchless sensing system comprises one or more capacitive sensors which are sensitive to disturbances in their electric fields caused by a human body part in proximity to the one or more capacitive sensors; and
   wherein at least one electrode of each of the one or more capacitive sensors is located on a user-facing side of a display of the target device, the at least one electrode of each of the one or more capacitive sensors fabricated from transparent conductive material, so that the human user can see the display of the target device through the at least one electrode of each of the one or more capacitive sensors.

2. An apparatus according to claim 1 wherein the controller is configured, based on the one or more input signals, to estimate a location of a portion of a hand of the human user and to perform one or more of:
   generating a display signal based on the estimated location of the portion of the hand of the user which causes the display to display an indicia, a location of the displayed indicia on the display based on the estimated location of the portion of the hand; and
   estimating a proximity of the portion of the hand of the user to the display.

3. An apparatus according to claim 2 wherein at least one of:
   the display signal causes the display to change an appearance of the displayed indicia based on the estimated proximity of the portion of the hand of the user;
   the display signal causes the display to change an appearance of the displayed indicia based on the estimated proximity of the portion of the hand of the user and the change of the appearance of the displayed indicia comprises at least one of a change of color of the displayed indicia, size of the displayed indicia, brightness of the displayed indicia, changing shape of the displayed indicia, changing a color gradient of the displayed indicia and adding other indicia to the displayed indicia.

4. An apparatus according to claim 2 wherein the controller is configured, based on the one or more sensor input signals, to detect a circular motion made with a portion of the hand of the user.

5. An apparatus according to claim 2 wherein the display signal causes the display to vary a size of the displayed indicia in a manner correlated to the proximity of the portion of the hand to the display, and wherein the controller is configured to change the control signal and to thereby change the operation of the target device when: the size of the displayed indicia is the same, to within a suitable threshold, as one of one or more of one of the virtual inputs; and the location of the portion of the hand lacks motion, above a suitable threshold, for a threshold period of time.

6. An apparatus according to claim 1 wherein the retrofit interface apparatus comprises a retrofit display.

7. An apparatus according to claim 6 wherein the touchless sensing system and the retrofit display are fabricated as an integrated module.

8. An apparatus according to claim 1 wherein:
the touchless sensing system comprises one or more optical sensors located around the perimeter of the display and sensitive to changes in electromagnetic radiation reflected from a body of the user on the user-facing side of the display;
the one or more sensor input signals comprise one or more capacitive sensor signals from the one or more capacitive sensors and one or more optical sensor signals from the one or more optical sensors; and
the controller is configured to generate the control signal based on both the one or more capacitive sensor signals and the one or more optical sensor signals.

9. A touchless sensing system for receiving input to control an apparatus comprising a display, the touchless sensing system comprising:
one or more capacitive sensors which are sensitive to disturbances in their electric fields caused by a human body part in proximity to a user-facing side of the display;
one or more optical sensors located around the perimeter of the display and sensitive to changes in electromagnetic radiation reflected from a body of a user on the user-facing side of the display;
a controller connected to receive one or more capacitive sensor signals from the one or more capacitive sensors and one or more optical sensor signals from the one or more optical sensors and configured to generate a control signal based on both the one or more capacitive sensor signals and the one or more optical sensor signals and to operate the apparatus using the control signal.

10. A system according to claim 9 wherein at least a portion of the one or more capacitive sensors are located around a perimeter of the of a target device and are sensitive to disturbances in an their electric fields caused by a human body part in proximity to the user-facing side of the display in a middle of the perimeter.

11. A system according to claim 9 wherein at least one electrode of each of the one or more capacitive sensors is located on the user-facing side of a display the display of the target device, the at least one electrode of each of the one or more capacitive sensors fabricated from transparent conductive material, so that the human user can see the display of the target device through the at least one electrode of each of the one or more capacitive sensors.

12. A retrofit interface apparatus for interfacing with a target device to provide the target device with touchless user input, the apparatus comprising:
a touchless sensing system comprising one or more sensors responsive to touchless input made by a human user and for generating one or more corresponding sensor input signals;
a controller connected to receive the one or more sensor input signals from the touchless sensing system and configured to generate, based on the one or more sensor input signals, a corresponding control signal;
the controller connectable to the target device to bypass a touch-based input of the target device and to provide the control signal as an input to an existing control system of the target device to thereby cause the control system of the target device to operate the target device based on the control signal;
wherein the one or more sensors comprise one or more capacitive sensors which are sensitive to disturbances in their electric fields caused by a human body part in proximity to the one or more capacitive sensors and the one or more capacitive sensors generate one or more corresponding capacitive sensor signals which form at least part of the sensor input signals; and
wherein at least a portion of the one or more capacitive sensors are located around a perimeter of a display of the target device and are sensitive to disturbances in their electric fields caused by the human body part in proximity to a user-facing side of the display in a middle of the perimeter.

13. An apparatus according to claim 12 wherein:
the touchless sensing system comprises one or more optical sensors located around the perimeter of the display and sensitive to changes in electromagnetic radiation reflected from a body of the user on the user-facing side of the display;
the one or more sensor input signals comprise one or more capacitive sensor signals from the one or more capacitive sensors and one or more optical sensor signals from the one or more optical sensors; and
the controller is configured to generate the control signal based on both the one or more capacitive sensor signals and the one or more optical sensor signals.

14. An apparatus according to claim 13 wherein each of the one or more optical sensors comprises one or more lasers for emitting laser radiation and a detector located to receive laser radiation reflected from a body part of the user.

15. An apparatus according to claim 14 wherein each optical sensor comprises suitable optics located to receive the emitted laser radiation and to generate a 2-dimensional plane of laser radiation and wherein the controller is configured to estimate two orthogonal spatial coordinates of the body part based on the body part intersecting the 2-dimensional plane.

16. An apparatus according to claim 15 wherein the controller is configured to estimate a third orthogonal spatial coordinate of the body part based on the capacitive sensor signal.

17. An apparatus according to claim 16 wherein third orthogonal spatial coordinate is a z-coordinate which reflects a distance of the body part from a plane that is tangential to the display of the target device along a normal to the plane and the first and second orthogonal spatial coordinates are transverse x- and y-coordinates which reflect distances of the body part in directions that are orthogonal to the normal of the plane and orthogonal to one another.

18. An apparatus according to claim 12 wherein at least one electrode of each of the one or more capacitive sensors is located on the user-facing side of the display of the target device, the at least one electrode of each of the one or more capacitive sensors fabricated from transparent conductive material, so that the human user can see the display of the target device through the at least one electrode of each of the one or more capacitive sensors.

19. An apparatus according to claim 12 wherein the retrofit interface apparatus comprises a retrofit display.

20. A method for interfacing with a target device to provide the target device with touchless user input, the method comprising:
- detecting a touch-free input corresponding to a gesture made by a human user and generating one or more corresponding input signals in response thereto;
- providing a controller connected to receive the one or more input signals and generating, by the controller and based on the one or more input signals, a corresponding control signal; and
- connecting the controller to the target device to bypass a touch-based input of the target device and to provide the control signal as an input to an existing control system of the target device to thereby cause the control system of the target device to operate the target device based on the control signal;
- wherein detecting the touch-free input comprises mounting a touchless sensing system comprising one or more sensors responsive to touchless input;
- wherein the one or more sensors comprise one or more capacitive sensors which are sensitive to disturbances in their electric fields caused by a human body part in proximity to the one or more capacitive sensors and the one or more capacitive sensors generating one or more corresponding capacitive sensor signals which form at least part of the input signals;
- wherein at least one electrode of each of the one or more capacitive sensors is located on a user-facing side of a display of the target device, the at least one electrode of each of the one or more capacitive sensors fabricated from transparent conductive material, so that the human user can see the display of the target device through the at least one electrode of each of the one or more capacitive sensors.

* * * * *